US012015093B2

(12) United States Patent
Guyot-Sionnest et al.

(10) Patent No.: US 12,015,093 B2
(45) Date of Patent: Jun. 18, 2024

(54) MULTI-BAND INFRARED IMAGING USING STACKED COLLOIDAL QUANTUM-DOT PHOTODIODES

(71) Applicant: The University of Chicago, Chicago, IL (US)

(72) Inventors: Philippe Guyot-Sionnest, Chicago, IL (US); Xin Tang, Chicago, IL (US); Matthew M. Ackerman, Chicago, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 273 days.

(21) Appl. No.: 17/422,973

(22) PCT Filed: Jan. 31, 2020

(86) PCT No.: PCT/US2020/016049
§ 371 (c)(1),
(2) Date: Jul. 14, 2021

(87) PCT Pub. No.: WO2020/160370
PCT Pub. Date: Aug. 6, 2020

(65) Prior Publication Data
US 2022/0085225 A1 Mar. 17, 2022

Related U.S. Application Data

(60) Provisional application No. 62/870,218, filed on Jul. 3, 2019, provisional application No. 62/799,827, filed on Feb. 1, 2019.

(51) Int. Cl.
*H01L 31/0352* (2006.01)
*H01L 27/146* (2006.01)
(Continued)

(52) U.S. Cl.
CPC ............ *H01L 31/035218* (2013.01); *H01L 27/14652* (2013.01); *H01L 31/1013* (2013.01); *H01L 31/1828* (2013.01)

(58) Field of Classification Search
CPC ......... H01L 31/035218; H01L 31/1013; H01L 31/1828; H01L 31/0296; H01L 31/02963;
(Continued)

(56) References Cited

U.S. PATENT DOCUMENTS 5,457,331 A 10/1995 Kosai et al.
5,559,336 A 9/1996 Kosai et al.
(Continued)

FOREIGN PATENT DOCUMENTS

JP 2013-120880 A 6/2013

OTHER PUBLICATIONS

Arup K. Rath et al., "Solution-Processed Heterojunction Solar Cells Based on p-type PbS Quantum Dots and n-type Bi 2 S 3 Nanocrystals," *Advanced Materials* 2011, vol. 23; pp. 3712-3717.
(Continued)

*Primary Examiner* — Sitaramarao S Yechuri
(74) *Attorney, Agent, or Firm* — Bell & Manning, LLC

(57) ABSTRACT

Photodetectors based on colloidal quantum dots and methods of making the photodetectors are provided. Also provided are methods for doping films of colloidal quantum dots via a solid-state cation exchange method. The photodetectors include multi-band photodetectors composed of two or more rectifying photodiodes stacked in aback-to-back configuration. The doping methods rely on a solid-state cation exchange that employs sacrificial semiconductor nanoparticles as a dopant source for a film of colloidal quantum dots.

24 Claims, 22 Drawing Sheets

(51) Int. Cl.
*H01L 31/101* (2006.01)
*H01L 31/18* (2006.01)

(58) Field of Classification Search
CPC . H01L 27/14652; C09K 11/892; B82Y 10/00; B82Y 20/00; B82Y 40/00
See application file for complete search history.

(56) References Cited

U.S. PATENT DOCUMENTS

| | | | |
|---|---|---|---|
| 5,581,084 | A | 12/1996 | Chapman et al. |
| 8,269,302 | B2 | 9/2012 | Tian et al. |
| 8,530,993 | B2 | 9/2013 | Tian et al. |
| 9,318,628 | B2 | 4/2016 | Guyot-Sionnest et al. |
| 10,290,753 | B2 | 5/2019 | Guyot-Sionnest et al. |
| 2002/0125472 | A1 | 9/2002 | Johnson et al. |
| 2003/0085441 | A1* | 5/2003 | Colace ............. H01S 5/0687 257/E31.022 |
| 2006/0249704 | A1 | 11/2006 | Ren et al. |
| 2011/0297217 | A1 | 12/2011 | Barkhouse et al. |
| 2013/0146998 | A1 | 6/2013 | Ting et al. |
| 2014/0264270 | A1 | 9/2014 | Dutta |
| 2018/0254421 | A1 | 9/2018 | Kinge et al. |
| 2022/0102570 | A1* | 3/2022 | Bessonov ....... H01L 31/035218 |

OTHER PUBLICATIONS

Brandon J. Beberwyck et al., "Cation Exchange: A Versatile Tool for Nanomaterials Synthesis," *The Journal of Physical Chemistry C* Oct. 3, 2013), vol. 117, No. 39; pp. 19759-19770.
Huan Liu et al., "Systematic optimization of quantum junction colloidal quantum dot solar cells," *Applied Physics Letters* (2012), vol. 101, pp. 151112-1-151112-3. DOI: 1063/1.4757866.
Alexandros Stavrinadis et al., "Strategies for controlled electronic doping of colloidal quantum dots," ICFO—Institut de Ciencies Fotoniques, Barcelona Institute of Science and Technology, 08860 Castelldefels (Barcelona), Spain; pp. 1-31.
Daniel B. Straus et al., "Increased Carrier Mobility and Lifetime in CdSe Quantum Dot Thin Films Through Surface Trap Passivation and Doping," Department of Chemistry, Department of Materials Science and Engineering, Department of Electrical and Systems Engineering, University of Pennsylvania, Philadelphia, PA; pp. 1-18.
Emmanuel Lhuillier et al., "Recent Progresses in Mid Infrared Nanocrystal based Optoelectronics," *IEEE Journal of Selected Topics in Quantum Electronics*, Institute of Electrical and Electronics Engineers, 2017, vol. 23, No. 5; pp. 6000208. 10.1109/JSTQE. 2017.2690838 hal-01508748.
Joseph M. Luther et al., "Schottky Solar Cells Based on Colloidal Nanocrystal Films," *Nano Letters* 2008, vol. 8, No. 10; ppl: 3488-3492.
Chia-Wei Wang et al., "Detection of mercury ions using silver telluride nanoparticles as a substrate and recognition element through surface-enhanced Raman scattering," *Frontiers in Chemistry* Oct. 2013, vol. 1, Article 20; pp. 1-5.
Guyot-Sionnest, Philippe, and John Andris Roberts. "Background limited mid-infrared photodetection with photovoltaic HgTe colloidal quantum dots." *Applied Physics Letters* 107.25 (2015): 253104.
Moreno-Garcia, Harumi, M. T. S. Nair, and P. K. Nair. "Chemically deposited lead sullide and bismuth sulfide thin films and Bi2S3/PbS solar cells." *Thin Solid Films* 519.7 (2011): 2287-2295.
Saha, Sudip K., Abhijit Bera, and Amlan J. Pal. "Improvement in PbS-based hybrid bulk-heterojunction solar cells through band alignment via bismuth doping in the nanocrystals." *ACS applied materials & interfaces* 7.16 (2015): 8886-8893.
Böberl, Michaela, et al. "Inkjet-Printed Nanocrystal Photodetectors Operating up to 3 μm Wavelengths." *Advanced Materials* 19.21 (2007): 3574-3578.
Samal, A. K., and T. Pradeep. "Hybrid A-B-A type nanowires through cation exchange." *Nanoscale* 3.11 (2011): 4840-4847.
Matthew M. Ackerman et al., "Fast and Sensitive Colloidal Quantum Dot Mid-Wave Infrared Photodetectors," *ACS Nano* 2018, vol. 12; pp. 7264-7271.
Zhenyu Jiang et al., "Ultra-Sensitive Tandem Colloidal Quantum-Dot Photodetectors," *Nanoscale* Accepted Manuscript, vol. 1, No. 1, pp. 1-6. DOI: 10.1039/x0xx00000x.
M. Nurual Abedin et al., "Characterization of Dual-Band Infrared Detectors for Application to Remote Sensing," Proceedings of SPIE 2005, vol. 5883, (SPIE, Bellingham, WA, 2005) DOI: 10.1117/12. 614938; pp. 588307-1-588307-8.
J. M. Arias et al., "HgCdTe dual-band infrared photodiodes grown by molecular beam epitaxy," *Journal of Applied Physics* (1991), vol. 70; pp. 4620-4622. DOI: 10.1063/1.349099.
Hong-Shi Ling et al., "Voltage-tunable dual-band quantum dot infrared photodectectors for temperature sensing," *Optics Express* May 7, 2012, vol. 20, No. 10; pp. 10484-10489.
Luca De Trizio et al., "Forging Colloidal Nanostructures via Cation Exchange Reactions," *Chemical Reviews* 2016, vol. 116; pp. 10852-10887.
Xin Tang et al., "Scalable Fabrication of Infrared Detectors with Multispectral Photoresponse Based on Patterned Colloidal Quantum Dot Films," *ACS Photonics* 2016, vol. 3; pp. 2396-2404.
Adrienne D. Stiff-Roberts, "Quantum-dot infrared photodetectors: a review," *Journal of Nanophotonics* (Apr. 14, 2009), vol. 3, 031607.
Norris, David J. "Multispectral quantum-dot photodetectors." *Nature Photonics* 13.4 (2019): 230.
Cryer, Matthew E., and Jonathan E. Halpert. "300 Nm spectral resolution in the mid-infrared with robust, high responsivity flexible colloidal quantum dot devices at room temperature." *ACS Photonics* 5.8 (2018): 3009-3015.
The International Search Report and the Written Opinion dated May 26, 2020 for International application No. PCT/US20/16049; pp. 1-9.
Mengyu Chen et al., "Mercury Telluride Quantum Dot Based Phototransistor Enabling High-Sensitivity Room-Temperature Photodetection at 2000 nm," *ACS Nano* 2017, vol. 11; pp. 5614-5622.
Matthew M. Ackerman et al., "Fast and Sensitive Colloidal Quantum Dot Mid-Wave Infrared Photodetectors," *ACS Nano*, Just Accepted Manuscript Jul. 5, 2018, vol. 12; pp. 1-28. DOI: 10.1021/ acsnano.8b03425.
A. Rogalski: "New Material systems for third generation infrared detectors," Ninth International Conference on Correlation Optics, PROC. Of SPIE, vol. 7388, Jan. 1, 2009; pp. 1-12. doi:10.1117/12. 852524.
A.G. U. Perera et al.: "Photo Detectors for Multi-Spectral Sensing," 2011 11th IEEE International Conference on Nanotechnology, Portland Marriott, Aug. 15-18, 2011, Portland, Oregon, USA; pp. 1-6. DOI: 10.1109/NANO.2011.6144295.
The extended European search report dated Nov. 16, 2022 for European patent application No. 20748763.8; pp. 1-6.
Tang, Xin et al., Direct Imprinting of Quasi-3 D Nanophotonic Structures into Colloidal Quantum-DotDevices, *Advanced Materials*, Jan. 20, 2020, vol. 32; pp. 19065901-1-19065901-8.

* cited by examiner

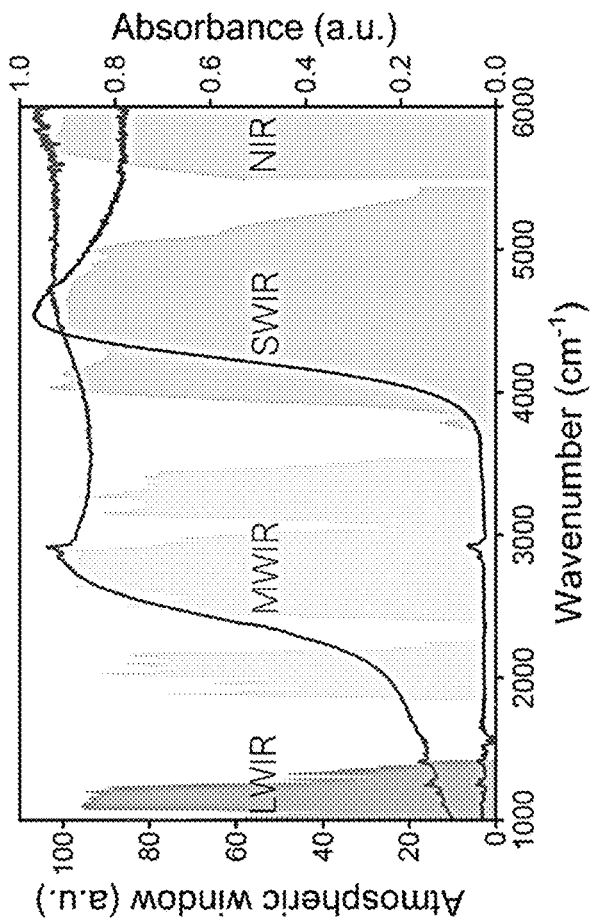
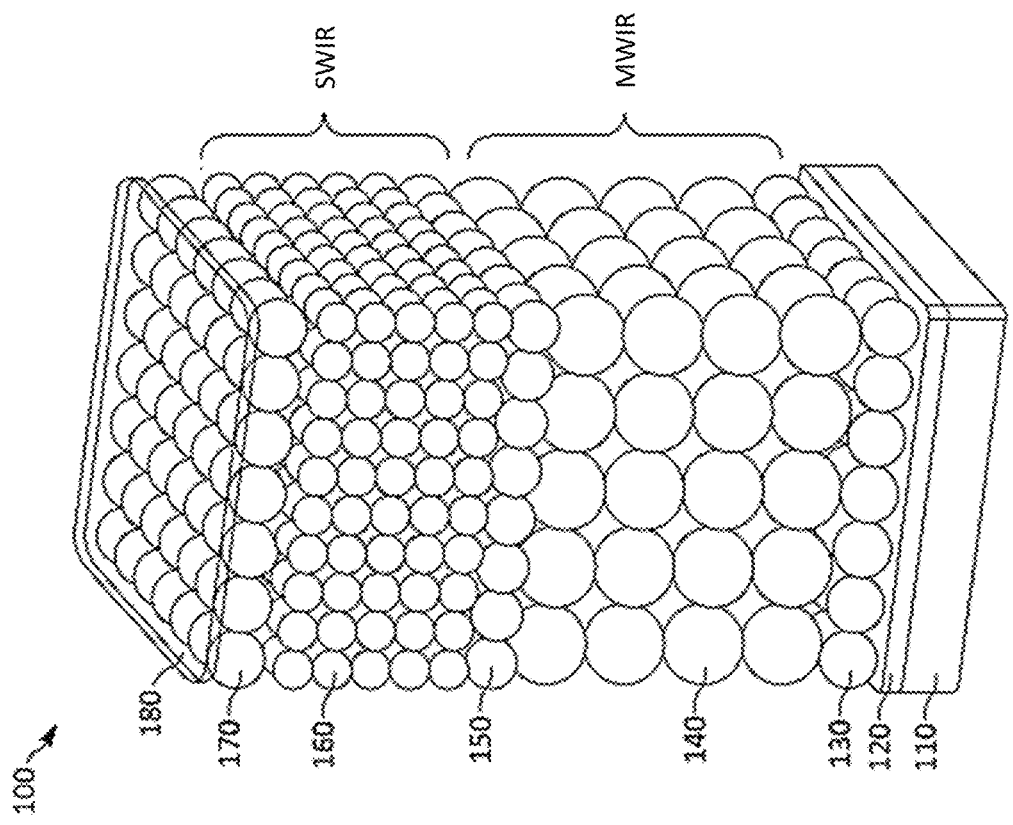
FIG. 1B
FIG. 1A

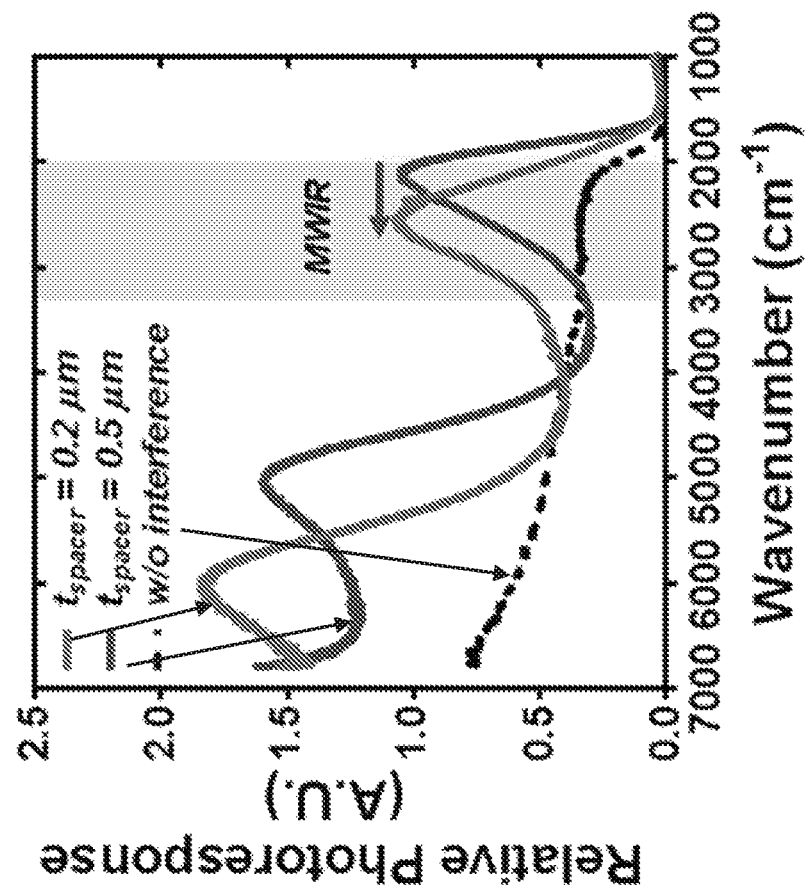
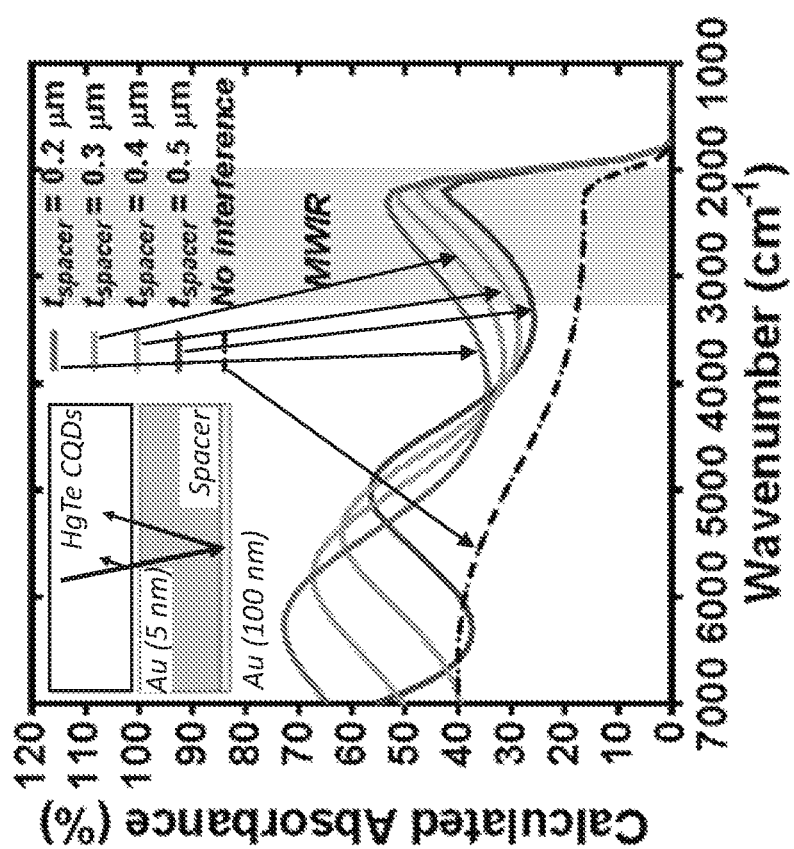
FIG. 9A
FIG. 9B

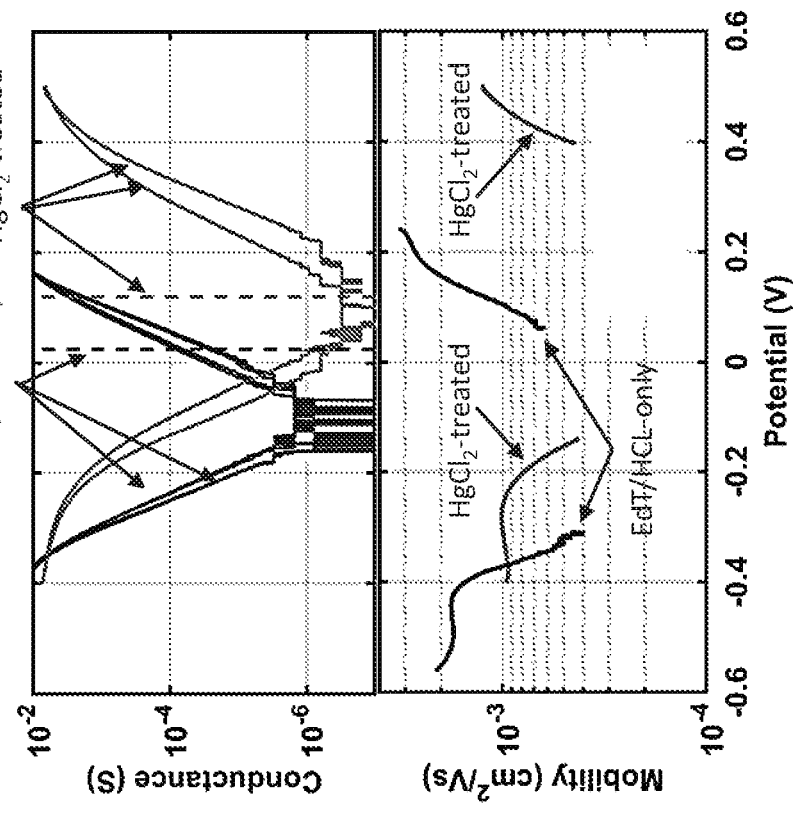
FIG. 12B
FIG. 12C
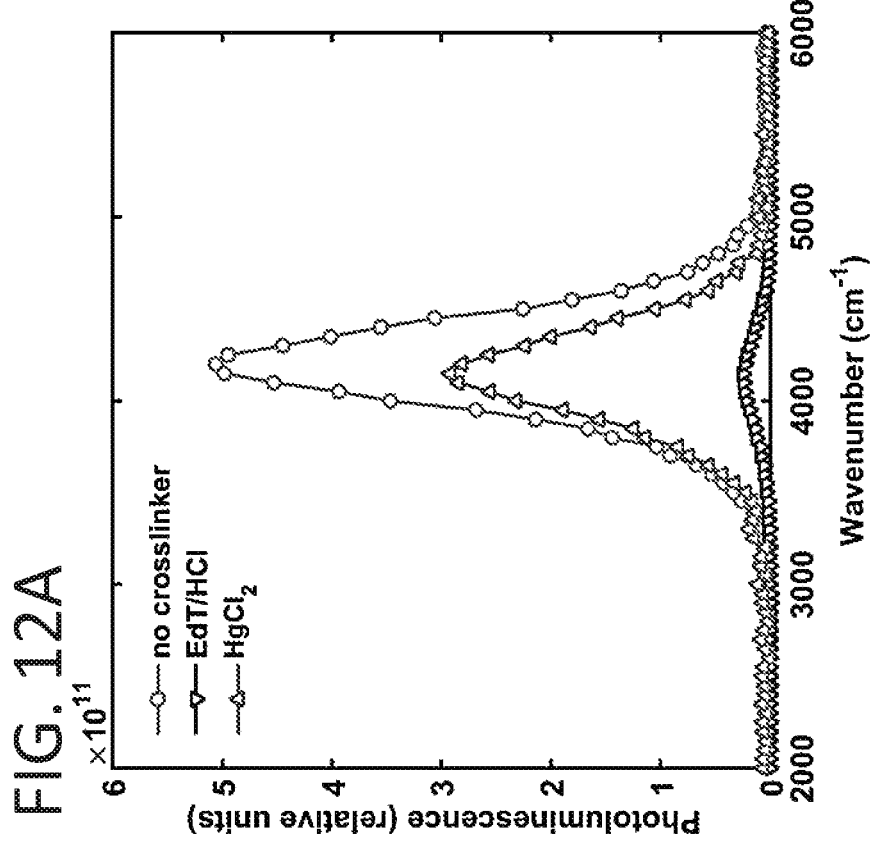
FIG. 12A

MULTI-BAND INFRARED IMAGING USING STACKED COLLOIDAL QUANTUM-DOT PHOTODIODES

CROSS-REFERENCE TO RELATED APPLICATIONS

This application is a National Stage of International Application No. PCT/US2020/016049, filed Jan. 31, 2020, which claims the benefit of U.S. patent application Ser. No. 62/799,827, filed Feb. 1, 2019 and U.S. patent application Ser. No. 62/870,218, filed Jul. 3, 2019, the entire contents of both of which are incorporated herein by reference.

REFERENCE TO GOVERNMENT RIGHTS

This invention was made with government support under grant numbers W911NF-15-1-0110 and W911NF-18-1-0207 awarded by the Army Research Office. The government has certain rights in the invention.

BACKGROUND

Infrared imaging has evolved from single-element imaging, to single-color focal plane array (FPA) imaging, to the third generation: low-cost, high-resolution imaging with multispectral sensing capability, which attracts increasing interest due to the growing need to extract coincident spectral information to give better object identification by processing signals from different wavebands. One major group of multispectral infrared detectors focuses on dual-band detection, which is currently dominated by mature material technologies like HgCdTe (MCT), quantum-wells, and type-II superlattices. However, suffering from high fabrication complexity, low production yield, and high cost, the application has been limited to military and scientific research. Yet, there are many opportunities for civilian application, such as thermal imaging, autonomous driving assistant, and industrial inspection. More importantly, the realization of dual-band detectors not only requires fabrication techniques to integrate multiple materials with different bandgaps into the same detector, but also needs a well-designed device architecture to access two separate channels.

The current trends in dual-band detectors have leaned towards integrating spectral selectivity into a single pixel without using external mechanical and optical components. In order to read two distinct channels in a vertical device, usually a three-terminal configuration would be used with one common ground contact, but that requires a complicated etching process and therefore reduces the optical fill factor of the stacked channels. For future development of high-resolution FPA with small pitches, a two-terminal configuration is more favorable. However, with only two terminals, the extraction of the photocurrent from each channel must be coded so that different channels could be selectively enabled.

SUMMARY

Single- and multi-band photodetectors based on CQDs, imaging arrays formed from a plurality of the photodetectors, and methods of making and using the photodetectors are provided. Also provided are methods for doping the CQDs via a solid-state cation exchange method.

One embodiment of a method of doping a film of colloidal semiconductor quantum dots includes the steps of: forming a film of colloidal quantum dots, the colloidal quantum dots comprising a quantum dot cation and a quantum dot anion; depositing semiconductor nanoparticles on the film of colloidal quantum dots, the semiconductor nanoparticles comprising a nanoparticle cation and a nanoparticle anion, wherein the nanoparticle anion is the same anion as the quantum dot anion; and contacting the deposited semiconductor nanoparticles with a solution comprising quantum dot precursors in a solvent, the quantum dot precursors comprising a precursor cation and a precursor anion, wherein the quantum dot precursors undergo cation exchange with the semiconductor nanoparticles and the film of colloidal quantum dots becomes doped with nanoparticle cations that are released from the semiconductor nanoparticles during the cation exchange.

One embodiment of a multiband photodetector includes: a first photodiode comprising a first layer of colloidal quantum dots; a second photodiode arranged in a stacked, back-to-back configuration with the first photodiode, the second photodiode comprising a second layer of colloidal quantum dots; a p-doped region formed in the first layer of colloidal quantum dots at an interface between the first and second photodiodes; a p-doped region formed in the second layer of colloidal quantum dots at the interface between the first and second photodiodes a first electrode in electrical communication with the first photodiode; a second electrode in electrical communication with the second photodiode, wherein at least one of the first and second electrodes is transparent across at least a portion of the electromagnetic spectrum; and a voltage source configured to apply and adjust a bias voltage across the first and second electrodes. The photodetector exhibits a photoresponse over a first wavelength range when biased within a first range of bias voltages and the second photodiode exhibits a photoresponse over a second wavelength range when biased within a second range of bias voltages.

One embodiment of a single-band photodetector includes: a rectifying photodiode comprising a layer of colloidal quantum dots, wherein the photodiode exhibits a photoresponse over a wavelength range when biased within a range of bias voltages; a first electrode in electrical communication with the rectifying photodiode; a second electrode in electrical communication with the rectifying photodiode, wherein at least one of the first and second electrodes is transparent across at least a portion of the electromagnetic spectrum; a p-doped region formed within the layer of colloidal quantum dots at the first electrode side of the layer of colloidal quantum dots; an n-type layer between the second electrode and the rectifying photodiode; and a voltage source configured to apply and adjust a bias voltage across the rectifying photodiode.

BRIEF DESCRIPTION OF THE DRAWINGS

Illustrative embodiments of the invention will hereafter be described with reference to the accompanying drawings, wherein like numerals denote like elements.

FIGS. 1A-1D depict the design and working principle of HgTe-based colloidal quantum dots (CQDs) dual-band detectors. FIG. 1A shows an illustration of the structure of a dual-band HgTe-based CQD imaging device. The short-wave infrared (SWIR) photodiode is placed on top of the mid-wave infrared (MWIR) photodiode with top-side illumination. Bias voltage is applied between indium tin oxide (ITO) and an Au contact (grounded). FIG. 1, left axis, shows the atmospheric transmission window for near-infrared (NIR) (5500-6900 $cm^{-1}$; 1818-1450 nm), SWIR (3571-5434 cm$^{-1}$; 2800-1840 nm), MWIR (1798-3545 cm$^{-1}$; 5562-2821 nm), long-wave infrared (LWIR) (714-1250 cm$^{-1}$; 14005-8000 nm). FIG. 1B, right axis, shows the optical absorption of SWIR and MWIR HgTe CQDs used to fabricate the dual-band device. The sizes of SWIR and MWIR CQDs are 6 nm and 9 nm, respectively. FIG. 1C shows a cross-sectional scanning electron microscopy image of the dual-band device. Scale bar: 300 nm. In the examples described herein, the typical thickness for SWIR and MWIR CQDs layers was ~400 nm. A 5 nm Au layer was used as the semi-transparent top contact with transmission of ~60%. FIG. 1D shows an energy diagram of the dual-band detector under 0V bias voltage without illumination at 85 K. ΔEc and ΔEv are the conduction band and valence band discontinuities. The shaded regions denote the MWIR and SWIR photodiodes.

FIG. 2A shows an IV curve of a dual-band detector under dark and light conditions. The positive and negative bias voltages are defined with respect to the Au contact. FIG. 2B shows the spectral response of a dual-band detector under bias voltage from positive (+500 mV) to negative bias (−300 mV) voltage at 85 K. The dashed black line is the response of the internal deuterated triglycine sulfate (DTGS) in Fourier-transform infrared spectroscopy (FTIR), which reflects the spectral irradiance of the internal FTIR blackbody. FIG. 2C shows specific detectivity as a function of temperature under positive (+500 mV) and negative bias (−300 mV) voltage. The dashed lines are results from a model. FIG. 2D (left axis) shows signal ratio between spectral response at 4 μm and 2.5 μm as a function of bias voltage. FIG. 2D (right axis) shows bias-dependent D* of the dual-band detector.

FIG. 4A shows an experimental setup of SWIR/MWIR signal ratio measurement as a function of temperature. FIG. 4B shows the photocurrent of the dual-band detector under light and dark conditions. The light and dark grey shaded areas are MWIR and SWIR photocurrents. The SWIR/MWIR ratio increases with higher object temperature. FIG. 4C shows a summary of the SWIR/MWIR ratio as a function of object temperature. The black dots are the measured SWIR/MWIR ratio as a function of blackbody temperature. FIG. 4D (left axis) shows the SWIR and MWIR signal as a function of detector-blackbody distance. FIG. 4E shows the SWIR/MWIR ratio as a function of operation frequency under different blackbody temperatures.

FIG. 6A shows current density as a function of bias voltage V under dark condition, background radiation, and 600° C. blackbody radiation at an operation temperature of 85 K. The inset figure zooms in on the dark current (closed shield) and background current (open shield). FIG. 6B shows the photocurrent spectrum at 85, 235, and 290 K. FIG. 6C shows responsivity, $\mathcal{R}$ (T). FIG. 6D shows D*(T) from the HgCl$_2$-treated HgTe CQDs MWIR detectors (black circles) and the HgTe PV MWIR detector (black arrow line) in Guyot-Sionnest, P. et al, Dots. Appl. Phys. Lett. 2015, 107, 253104.

FIG. 7A shows dark current density as a function of the applied potential V between 95 and 160 K. FIG. 7B shows temperature dependence of the resistance area product R$_0$A for devices treated with HgCl$_2$ (squares) and untreated (circles). Dashed lines are Arrhenius fits of the high temperature data points. FIG. 7C shows the open-circuit voltage V$_{oc}$ under 600° C. blackbody as a function of temperature for the HgCl$_2$-treated device. The dashed line is a linear fit.

FIG. 8A shows AC current amplitude plotted against AC frequency of 10 mV peak-to-peak voltage. Capacitance was determined by the slope of the linear regime. FIG. 8B shows capacitance as a function of the reverse-bias DC voltage. Larger reverse-bias voltage increases depletion width, decreasing capacitance. FIG. 8C shows resistance as a function of the DC reverse-bias voltage. The resistance is taken as the respective voltage in FIG. 8A divided by the zero-frequency current. FIG. 8D shows the Mott-Schottky plot for reverse-bias DC voltages. The slope of 2.5±0.1×10$^{20}$ F$^{-2}$V$^{-1}$ and forward-bias horizontal intercept of 70 mV were used to determine carrier density and built-in potential, respectively.

FIGS. 9A-9D depict interference-enhanced photoresponse and thermal imaging. FIG. 9A shows the calculated absorption of the HgTe layer without (dashed black line) and with the interference structure with different spacer thickness. The inset illustrates the interference structure. FIG. 9B shows the relative spectral photoresponse of HgTe CQD photodetectors without and with the interference structure normalized by the internal DTGS detector. FIG. 9C shows current-voltage characteristics of an interference-enhanced HgTe photodetector with 0.2 μm thick optical spacer. In the inset, I$_n$ refers to the current noise in a 1 Hz bandwidth. FIG. 9D shows the pulse response of the same interference-enhanced HgTe CQD photodetector at 80 and 160 K.

FIG. 10A shows the spectral response at 300 K normalized to the DTGS thermal detector response for EdT/HCl-only and HgCl$_2$-treated photodiodes. The 50% cutoffs are shown as dashed lines for each photodiode. FIG. 10B shows current density-voltage at 290 K in the dark (dashed lines) and with the blackbody (solid lines). FIG. 10C shows an Arrhenius plot of dark current density at 500-mV reverse bias voltage for EdT/HCl-only (circles) and HgCl$_2$-treated (triangles). The black dashed lines correspond to an activation energy of 320 meV.

FIG. 11A shows responsivity as a function of cutoff wavelength. The dotted and dashed lines indicate 20% and 50% external quantum efficiency (EQE), respectively. The standard deviation is indicated by the error bars, and the maximum (upward triangle) and minimum (downward triangle) values are provided. FIG. 11B shows R$_0$A versus cutoff wavelength. Dashed and solid lines indicate HgCdTe Rule-07 and InGaAs Rule-17, respectively. (W. E. Tennant, in *J. Electron. Mater.* (2010), pp. 1030-1035; and Y.-G. Zhang et al., Appl. Opt. 57, D141 (2018).) FIG. 11C shows specific detectivity versus cutoff wavelength. Also indicated is a prior HgTe CQD detector with a Fabry-Perot cavity and D* for commercial InGaAs and HgCdTe detectors. (X. Tang, et al., Small 15, 1804920 (2019).) As in FIG. 11A, the standard deviation, maximum, and minimum values are indicated.

FIG. 12A shows photoluminescence of HgTe CQD films. Untreated film (no crosslinker, circles), EdT/HCl-only (downward triangles), $HgCl_2$-treated (upward triangle). FIGS. 12B and 12C show electrochemical conductance and mobility measured for EdT/HCl-only and $HgCl_2$-treated HgTe CQD films. In FIG. 12B, the dashed lines indicate the equilibrium potential of the film.

DETAILED DESCRIPTION

Figure 1D:
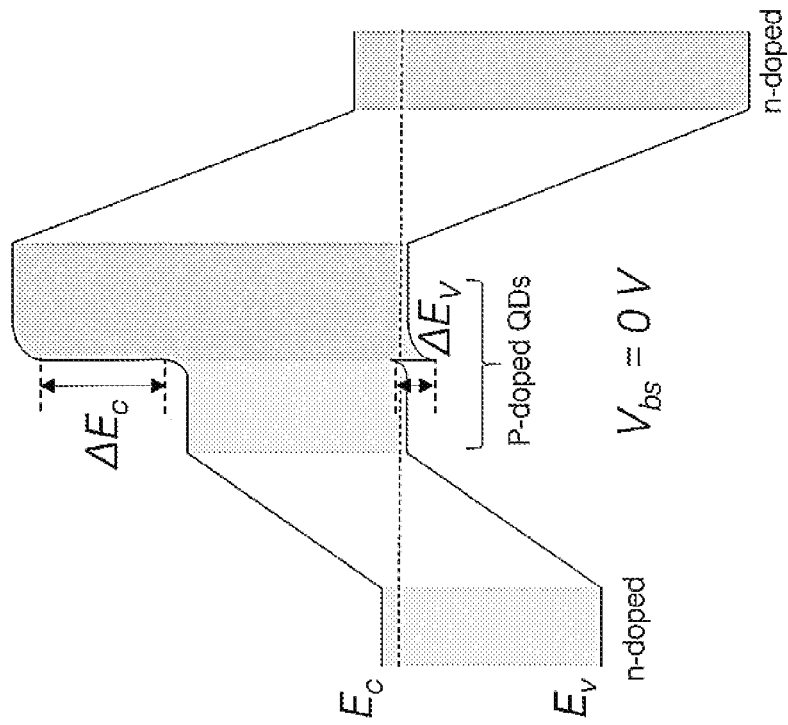

Photodetectors based on CQDs, imaging arrays formed from a plurality of the photodetectors, and methods of making the photodetectors are provided. Also provided are methods for doping the CQDs via a solid-state cation exchange method.

The photodetectors include single-band photodetectors, as well as multi-band photodetectors that are composed of two or more rectifying photodiodes stacked in a back-to-back configuration. In the multi-band photodetectors, the spectral responses of the photodiodes can be controlled by adjusting the polarity and magnitude of a bias voltage applied across the photodiode stack. Some embodiments of the multi-band photodetectors are infrared photodetectors in which a first rectifying photodiode and a second rectifying photodiode exhibit a photoresponse over different wavelength ranges of the infrared region of the electromagnetic spectrum, such as in the SWIR (i.e., wavelengths from about 0.9 to about 2.5 µm) and the MWIR (i.e., wavelengths from about 3 to about 5 µm).

FIG. 1A is a schematic illustration of one embodiment of a dual-band photodetector 100. For the purpose of illustration, HgTe-based CQDs are used as the active material in this photodetector 100. However, it should be understood that a dual-band photodetector having the same structure could be made using CQDs formed of other materials, including other mercury chalcogenides, such as HgS and HgSe. As will be understood by those skilled in the art, CQDs are semiconductor crystals formed from inorganic chemical reactants via colloidal synthesis; as such, CQDs are distinguishable from epitaxial quantum dots, which are grown on a substrate epitaxially or defined in a substrate lithographically. The CQDs have size-dependent optical properties due to effects of quantum confinement. The CQDs are typically spherically-shaped with nanoscale diameters in the range from, for example, 2 nm to 10 nm.

The dual band photodetector 100 is formed on a sapphire substrate 110 and sequentially comprises an ITO layer 120, an n-type layer 130 of $Bi_2Se_3$, a first layer 140 of CQDs, a p-type layer 150 of $Ag_2Te$, a second layer 160 of CQDs, an n-type layer 170 of $Bi_2Se_3$ capped by a gold contact layer 180 forming an electrode. In the illustrated embodiment, the ITO layer 120 forms the other electrode. The first and second layers 140, 160 of quantum dots have a p-doped region formed adjacent to the p-type $Ag_2Te$ layer 150 using the solid-state cation exchange doping method described herein. In some embodiments, the p-type layer 150 is no longer present in the final structure of the photodiode 100 after the above-described doping method has been used. However, retaining the p-type layer can be advantageous because this layer can create or improve the rectifying junctions for the photodiodes by suppressing dark current and providing an asymmetric IV curve. In some embodiments, one or both of the n-type layers 130, 170 of $Bi_2Se_3$ are also omitted. However, these layers can also be used to improve rectification.

The dual-band photodetector is, thus, composed of a first rectifying photodiode and a second rectifying photodiode arranged in a back-to-back, n-p-n configuration. The first rectifying photodiode includes the first layer 140 of CQDs having the p-doped CQD region and the n-type layer 130. The second photodiode includes the second layer 160 of CQDs having a p-doped quantum dot region and the n-type layer 170 that form a rectifying junction. The p-doped regions of the two photodiodes provide a hole tunneling layer. In the illustrative example shown here, silver telluride nanoparticles are used as the p-type dopant source. However, depending upon the desired dopant atom type, other types of dopant atom-containing nanoparticles could be used. By way of illustration, antimony telluride or copper telluride nanoparticles could be used as Sb and Cu dopant sources, respectively.

The CQD layers 140, 160 may also have n-doped regions formed adjacent to the corresponding n-type $Bi_2Se_3$ layers 130, 170. Generally, in the photodiodes, either the p-doped region, the n-doped region, or both will be formed within the CQD films. However, it is possible to use a separate layer of n-type or p-type material in contact with the CQD film, rather than a doped-region within the film, to complete the junction. For example, a layer of indium tin oxide (ITO), or another n-type semiconductor disposed between the CQD film and the electrode could act as an n-type layer. In some embodiments of the photodetectors, including the one shown in FIG. 1A, layers of n-type semiconductor nanoparticles (i.e., n-type layers) are provided between the first electrode and its neighboring CQD layer and between the second electrode and its neighboring CQD layer. In the illustrative example shown here, $Bi_2Se_3$ nanoparticles are used as the n-type layer. Other bismuth chalcogenides having the formula $Bi_2X_3$, where X is Te or S, also could be used. In some embodiments, the layer 130 of $Bi_2Se_3$ nanoparticles as shown in FIG. 1A could be omitted, and the ITO layer 120 could form the n-type layer.

As illustrated in FIG. 1A, the sizes of the quantum dots in the first and the second photodiodes are different, so that the two photodiodes have photocurrent peaks in different regions of the electromagnetic spectrum under an applied bias. In the dual-band photodetector shown in FIG. 1A, the upper photodiode employs smaller quantum dots in its active layer and, therefore, would exhibit a photoresponse at shorter wavelengths than the lower photodiode. However, the photodetector could also be arranged such that the photodiode having a photoresponse at longer wavelengths was at the top of the stack. It is also contemplated that the CQDs of the first and second photodiodes are composed of different materials having a photoresponse at different wavelengths.

The dual-band photodetector further includes a first electrode and a second electrode, at least one of which is transparent in the region of the electromagnetic spectrum to be detected. As used herein, the term transparent does not require the transmission of 100% of the radiation to be detected. Rather, it is sufficient that the degree of transmission is sufficient to render the photodetector sufficiently sensitive for its intended application. Typically, a transmission of at least 50%, at least 60%, at least 70%, or at least 90% is sufficient for an electrode to be considered transparent. The transparency may be imparted to the electrode by virtue of the thickness of the electrode, the material from which the electrode is made, or both. The first and second electrodes are configured to apply a bias voltage across the photodiodes, using a voltage source.

Although the embodiment of the photodetector shown in FIG. 1A has an n-p-n configuration, photodetectors having a p-n-p configuration can also be fabricated. In the p-n-p configuration, the p-doped regions (or p-type layer) would be formed at the electrode sides of the CQD films, and the n-type layer (or n-doped regions) would be located between the first and second photodiodes. For example, the $Bi_2X_3$ nanoparticle layers in the detector of FIG. 1A could be replaced by p-doped regions at the electrode sides of the first and second CQD films, and the p-doped regions at the interface of the two photodiodes could be replaced by a $Bi_2X_3$ nanoparticle layer to provide a p-n-p configuration.

When radiation of an appropriate wavelength is incident upon the quantum dots of the photodetector, electron-hole pairs are created and are separated by a built-in potential. The separated carriers then flow towards their respective collection contacts, thereby producing a photocurrent output. The production of this photocurrent is referred to herein as a photoresponse. The wavelength range over which a given photodiode exhibits a photoresponse will be characteristic of the types and sizes of the CQDs that make up the active region of the photodiode. Therefore, the first photodiode will produce a photocurrent peak over a first wavelength region and the second photodiode will produce a photocurrent peak over a second wavelength region. The two wavelength regions will differ, although there may be some overlap in the photocurrent peaks. Moreover, the photoresponse for each of the photodiodes will depend on the magnitude and/or polarity of the bias voltage. Therefore, by adjusting the bias voltage, different photodiodes in the photodetector stack can be "activated" independently to provide switching between different detection modes. By calibrating the response of the different photodiodes, the multi-band photodetectors can be used as temperature sensors to determine the absolute temperature of objects, irrespective of optical power and their distance from the detector.

Figures 5A, 5B:
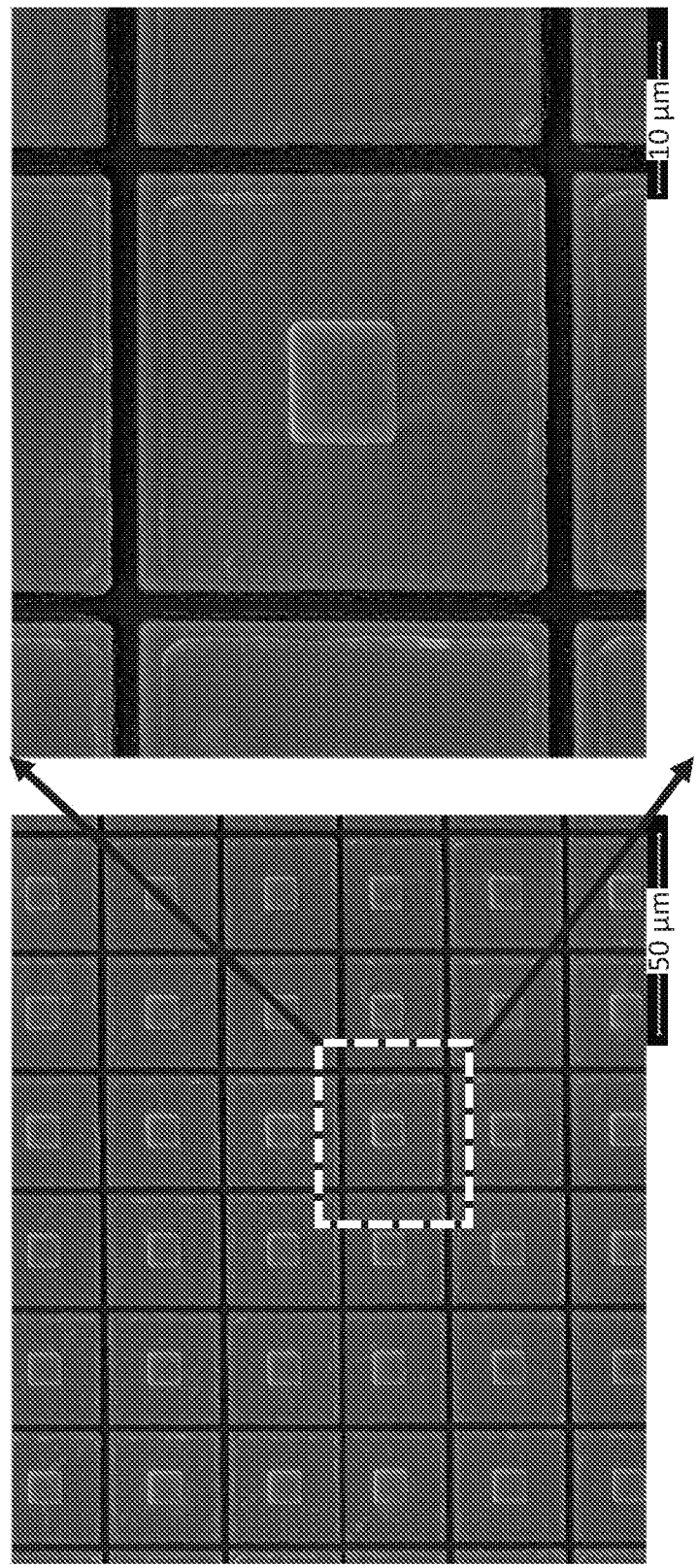
FIGS. 5A and 5B show a pixelated HgTe CQDs film with a trench width and pixel size of 3 μm and 27 μm.

Multi-band photodetectors and, in particular SWIR and MWIR dual-band photodetectors, are useful in a wide variety of applications, including semiconductor wafer inspection, chemical detection, and surveillance. In addition, multi-band detectors can produce merged color images of two or more colors and provide more information than the single-color images. Arrays of individually addressable detectors can be fabricated to provide a pixel array, as illustrated in the images of FIGS. 5A and 5B.

While multi-band photodetectors are particularly useful for certain applications, single-band photodetector are also useful. Therefore, the methods described herein can also be used to make single-band photodetectors that include a single photodiode with a single CQD film having a p-doped region and/or an n-doped region. For example, a single-band detector can be fabricated using the procedures described herein. By way of illustration, a SWIR detector can be fabricated that has each of the components shown in FIG. 1A, other than the film of larger HgTe CQDs and the lower layer of $Bi_2Se_3$ nanoparticles. Similarly, a MWIR detector can be fabricated that has each of the components shown in FIG. 1A, other than the film of smaller HgTe CQDs and the upper layer of $Bi_2Se_3$ nanoparticles.

The quantum dot layers in the photodiode of FIG. 1A can be doped using a solid-state cation exchange CQD doping method. The solid-state cation exchange CQD doping method could be used for doping CQD layers for purposes other than forming the photodiode as discussed herein. The solid-state cation exchange CQD doping method employs sacrificial semiconductor nanoparticles, which may themselves be CQDs, as a dopant source for films of quantum dots in the photodiodes. The CQDs of the photodiodes include a cation (i.e., a quantum dot cation) and an anion (i.e., a quantum dot anion). For example, for HgTe quantum dots, Hg is the quantum dot cation and Te is the quantum dot anion. The sacrificial semiconductor nanoparticles also include a cation (i.e., a nanoparticle cation) and an anion (i.e., a nanoparticle anion). For example, for $Ag_2Te$ nanoparticles, Ag is the nanoparticle cation and Te is the nanoparticle anion. The nanoparticle cation can be used to form a doped region in an adjacent layer of CQDs via cation exchange. The nanoparticle anion is the same anion as the quantum dot anion.

As used herein, the term "nanoparticle" generally refers to a particle having at least one nanoscale dimension and, typically, two or three nanoscale dimensions (i.e., length, width, and height or, in the case of substantially spherical nanoparticles, diameter); thus, nanoparticles include particles having one or more dimensions that measure 1000 nm or smaller. This includes particles having one or more dimensions that are 500 nm or smaller and particles having one or more dimensions that are 100 nm or smaller.

In the methods described herein, quantum dot precursors are used to carry out doping on a pre-formed film that includes a layer of the sacrificial semiconductor nanoparticles over or under a layer of CQDs. The quantum dot precursors, include a cation (i.e., a precursor cation) and an anion (i.e., a precursor anion). For example, for a $HgCl_2$ quantum dot precursor, Hg is the precursor cation and Cl is the precursor anion. In some embodiments of the methods, the precursor cation is the same cation as the CQD cation. However, the precursor cation need not be the same cation as the CDQ cation. The quantum dot precursors can be inorganic salts, metal complexes, or adducts. The quantum dot precursors are so called because they react with the semiconductor nanoparticles to form quantum dots, as described in more detail below and illustrated in the Examples.

When a film that includes the CQDs and the semiconductor nanoparticles is exposed to a solution that includes a quantum dot precursor, the quantum dot precursor and the sacrificial semiconductor nanoparticles undergo cation exchange, whereby new quantum dots are formed, and the nanoparticle cations are released from the sacrificial semiconductor nanoparticles. The released cations are then immobilized within the quantum dots or immobilized near the quantum dots, where they act as dopants by increasing the carrier concentration. The resulting doped region in the layer of QDs is spatially stable and has a finite thickness that does not extend through the entirety of the CQD layer. By way of illustration only, the doping depth can be limited to 50% of the thickness of the CQD film or less, 30% of the thickness of the CQD film or less, 10% of the thickness of the CQD film or less, or 1% of the thickness of the CQD film or less. By way of illustration, the CQD films may have a thickness in the range from 100 nm to 1000 nm, including from 200 nm to 600 nm. However, thicknesses outside of these ranges can also be used. Depending on the type of cation present in the sacrificial nanoparticles, the dopants may be p-type or n-type, and the resulting doped region may be p-doped or n-doped. Dopant concentrations that can be achieved include concentrations in the range from about $10^{15}$ $cm^{-3}$ to about $10^{23}$ $cm^{-3}$, including in the range from $10^{20}$ $cm^{-3}$ to $10^{22}$ $cm^{-3}$.

Although the inventors do not intend to be limited to any particular theory behind the doping mechanism, the limited doping depth may be attributed to the release of the dopant cations in the form of a relatively low-solubility salt compound comprising the dopant cations and the anions of the quantum dot precursor. This salt is smaller than the semiconductor nanoparticles and, therefore, can diffuse more readily into the CQD film. The size of the nanoparticles can affect the depth of the doping region because smaller semiconductor nanoparticles can penetrate more deeply into the CQD layer. Thus, larger nanoparticles can be used to create shallower doping regions. However, if the nanoparticles are too large, they may have a poor size distribution and poor colloidal stability. By way of illustration only, in some embodiments of the methods, semiconductor nanoparticles having diameters in the range from 5 nm to 10 nm are used. However, nanoparticles having diameters outside of this range also can be used.

The doping methods disclosed herein can be conducted at or near room temperature, including temperatures in the range from 20° C. to 25° C. The capability of low-temperature processing provides an advantage over conventional thermal diffusion doping because it can be carried out without the need for high temperature processing. This is beneficial for CQDs, such as mercury chalcogenide quantum dots, that are susceptible to the loss or degradation of their optical and electronic properties upon thermal annealing. It should be understood that the CQD layers 140, 160 could be doped using any suitable doping method.

The doping process can be used to dope a variety of quantum dots using a variety of semiconductor nanoparticles, provided that the quantum dots being produced in the chemical conversion of the semiconductor nanoparticles have a lower solubility in the conversion solution than do the semiconductor nanoparticles. Solvents for the conversion solutions will typically include polar, protic solvents, such as water, methanol, propanol, ethanol, and mixtures or two or more thereof. Films of mercury chalcogenide quantum dots, such as mercury telluride (HgTe) quantum dots, having a silver (Ag) doped surface layer of finite depth (i.e., a doped region) are examples of the types of films that can be formed using the methods described herein. Detailed descriptions of the process for doping films of HgTe with Ag are provided in the Example, below, and in M. M. Ackerman et al., ACS Nano 2018, 12, 7264-7271, the entire disclosure of which is incorporated herein by reference.

Other CQDs that can be doped using the methods described herein and incorporated as active materials in a photodetector include lead chalcogenides having the formula PbX and cadmium chalcogenides having the formula CdX, where X represents S, Se, or Te. Sacrificial semiconductor nanoparticles that can be used to dope the lead chalcogenide quantum dots and cadmium chalcogenide quantum dots include NiX nanoparticles, SbX nanoparticles, and SnX nanoparticles, where NiX nanoparticles would act as a p-type dopant source and SbX and SnX nanoparticles would act as n-type dopant sources. Guidance regarding the selection of appropriate quantum dots and sacrificial nanoparticles can be found in the literature, including in De Trizio et al., Chem. Rev., 2016, 116 (18), 10852-10887. Starting with the NiX, SbX, or SnX sacrificial nanoparticles, the conversion of the sacrificial nanoparticle layer partially or completely into PbX or CdX quantum dots could be performed using Pb halides (Cl, Br, I), Cd halides, Pb acetate, Cd acetate, Pb nitrate, cadmium nitrate, or other such soluble inorganic Pb and Cd metal salts, as the quantum dot precursors.

The cation-exchange-based doping methods can be used to form the doped regions in a CQD film during the fabrication of a photodetector. For example, a layer of sacrificial semiconductor nanoparticles that includes a p-type dopant cation can be disposed between the CQD films of two photodiodes in a dual-band photodetector. After the solid-state cation exchange doping process is completed, neighboring p-doped regions will be formed in both of the photodiodes. This is illustrated in detail in the Examples and described more generally directly below. Alternatively, a layer of sacrificial semiconductor nanoparticles that includes an n-type dopant cation can be disposed between the CQD films of two photodiodes to form neighboring n-doped regions in the stack. The p-doped or n-doped regions have a high carrier concentration and act as charge carrier (i.e., hole or electron) tunneling regions. In the doping process, the sacrificial nanoparticles are desirably entirely converted into a doped CQD region. However, it is not necessary that all of the sacrificial quantum dots be converted; part of the layer of sacrificial nanoparticles can remain and form a part of the charge carrier tunneling layer.

EXAMPLES

Example 1: Dual-Band IR Photodetector

This example describes the fabrication and operation of the dual-band detector illustrated in FIG. 1A, which includes one SWIR and one MWIR photodiode arranged in "n-p-n" structure with $Bi_2Se_3$ and $Ag_2Te$ as n- and p-layers. HgTe CQDs are used as the sensing material, since HgTe CQDs have a high spectral tunability. Different-sized HgTe CQDs were synthesized with a well-controlled absorption feature in the SWIR and MWIR regions, as shown in FIG. 1B. (Ackerman, M. M. et al., *ACS Nano* 12, 7264-7271 (2018).) The CQDs dual-band detector was fabricated by simple consecutive drop-casting or spin-coating of different colloidal nanomaterials followed by an associated cross-linking process.

A uniform and smooth CQD film was fabricated (FIG. 1C), and the constitution of the different layers was precisely defined without mixing of the two different HgTe CQD layers, as evidenced by the photoluminescence (PL) measurements of the dual-band detector, which revealed two clear, well-separated narrow peaks in the SWIR and MWIR ranges at a wide operation temperature range.

Figure 1C:
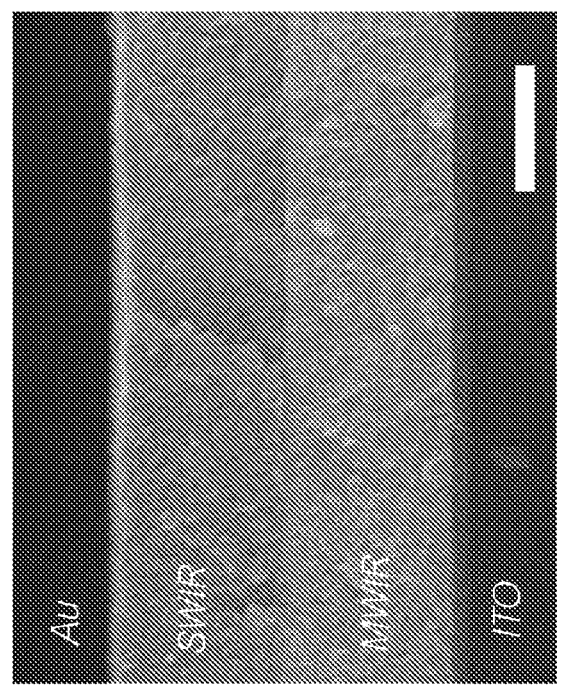

The successful operation of such dual-band detectors requires efficient photocarrier transport across the interface between the two opposite photodiodes. Both "p-n-p" and "n-p-n" structures could be designed. However, for HgTe CQDs, the heavy hole gives a much smaller contribution to the confinement energy than the light electron. Therefore, for identical surface conditions of SWIR and MWIR CQDs, the valence band offset $\Delta E_v$, should be much smaller than the conduction band offset $\Delta E_c$. This implies that the holes should flow most easily through the interface and that the "n-p-n" structure should be better. Using Anderson's rules, the energy diagram is then constructed. (Anderson, R. L. *IBM. Res. Dev.* 4, 283-287 (1960).) The simplified energy diagram of unbiased "n-p-n" is illustrated in FIG. 1D. The smaller $\Delta E_v$ was confirmed by field-effect transistor (FET) and Kelvin probe measurements, from which a conduction band discontinuity $\Delta E_c=0.14\pm0.01$ eV and a smaller valence band discontinuity $\Delta E_v=0.06\pm0.01$ eV were determined. Since the HgTe CQDs on the p-side are heavily doped, the moderate valence offset leads to a thin barrier across which the photoexcited holes can readily tunnel. In contrast, for the alternative "p-n-p" structure, the interfacial transport for photoexcited electrons from MWIR to SWIR is blocked by $\Delta E_c$, leading to a reduced MWIR response, which was indeed observed.

The construction of "n-p-n" configuration relies on spatially stable doping across the stacked CQD layers. $Ag_2Te$ nanocrystals are good p-dopants for HgTe CQDs by diffusion of Ag+ ions into adjacent HgTe CQDs. Moreover, with exposure to the HgCl$_2$ solution, a large amount of Ag+ ion was released from Ag$_2$Te and immobilized to the most adjacent HgTe CQDs in the form of insoluble AgCl, leading to spatially stable and reliable doping. By optimizing the size effect of the Ag$_2$Te nanocrystals on doping depth, a layer of strongly p-doped HgTe CQDs (+1.6±0.2 |e|/dot) can be engineered at optimal conditions (~9 nm Ag$_2$Te), leading to a well-rectifying junction with high photoresponse. For the n-side layer, bismuth chalcogenide nanocrystals (Bi$_2$X$_3$: Bi$_2$Te$_3$, Bi$_2$Se$_3$, and Bi$_2$S$_3$) are used as n-dopants, because n-type Bi$_2$X$_3$ has high electron density. Among Bi$_2$X$_3$, Bi$_2$Se$_3$ was found to be the best n-type layer in the examples described herein. Optical absorption of synthesized Bi$_2$Se$_3$ nanocrystals showed a plasmon resonance peak at ~1100 cm$^{-1}$, from which an electron density of 1.5×10$^{18}$ cm$^{-3}$ is estimated. The FET measurement of Bi$_2$Se$_3$/HgTe CQDs showed n-type behavior with an electron concentration of 0.12±0.01 e/dot. More importantly, the synthesized Bi$_2$Se$_3$ nanocrystals are in the form of heavily aggregated nanoplates with a size of ~50 nm, which prevents any possible diffusion and produces a stable interface. Unlike the case of Ag$_2$Te, where Ag+ diffusion is considered responsible for the p-doping, it is speculated that the n-doping is due to interfacial charge transfer from Bi$_2$Se$_3$ to HgTe CQDs. Although the electron doping is moderate, the room-temperature detectivity D* of the SWIR photodiode dramatically increased from 2.9×10$^9$ to 6×10$^{10}$ Jones with the addition of the thin Bi$_2$Se$_3$ layer, to the extent that the SWIR D* is now comparable with the commercial InGaAs SWIR detectors (PDA10D2, Thorlabs). Furthermore, the doping profile stability was confirmed by measuring the open-circuit voltage V$_{oc}$ over an extended time. The measured V$_{oc}$ remained almost unchanged over one month with multiple cycles of cooling down and warming up operation.

It's worth noting that, unlike CQDs solar cells or NIR photovoltaics, the approaches to make rectifying photodiodes using either Schottky structures or pn diodes by engineering surface ligands (e.g., S$^{2-}$, I$^-$, Br$^-$, Cl$^-$, 1,2-Ethanedithiol) yielded unstable devices with low responsivity (<10-2 A/W), indicating insufficient doping and difficulty in controlling the doping profile in the device stacks, possibly due to the uncontrollable diffusion or mixing of ligands between drop-casted layers. Those results revealed an overlooked fundamental difficulty in extending CQDs photovoltaics from visible to mid-infrared regions, associated with the much-reduced bandgaps and the much larger density of thermal carriers.

Figure 2A:
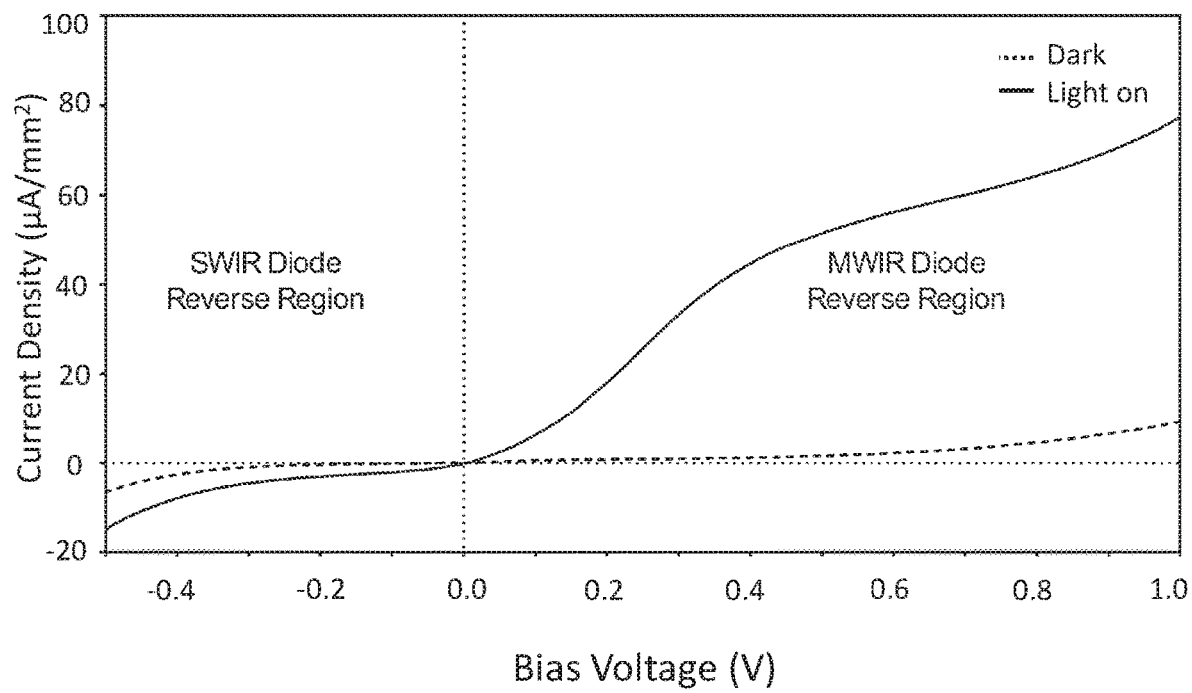
FIGS. 2A-2D depict photoresponse characterization of HgTe CQDs dual-band detectors.
Figure 2B:
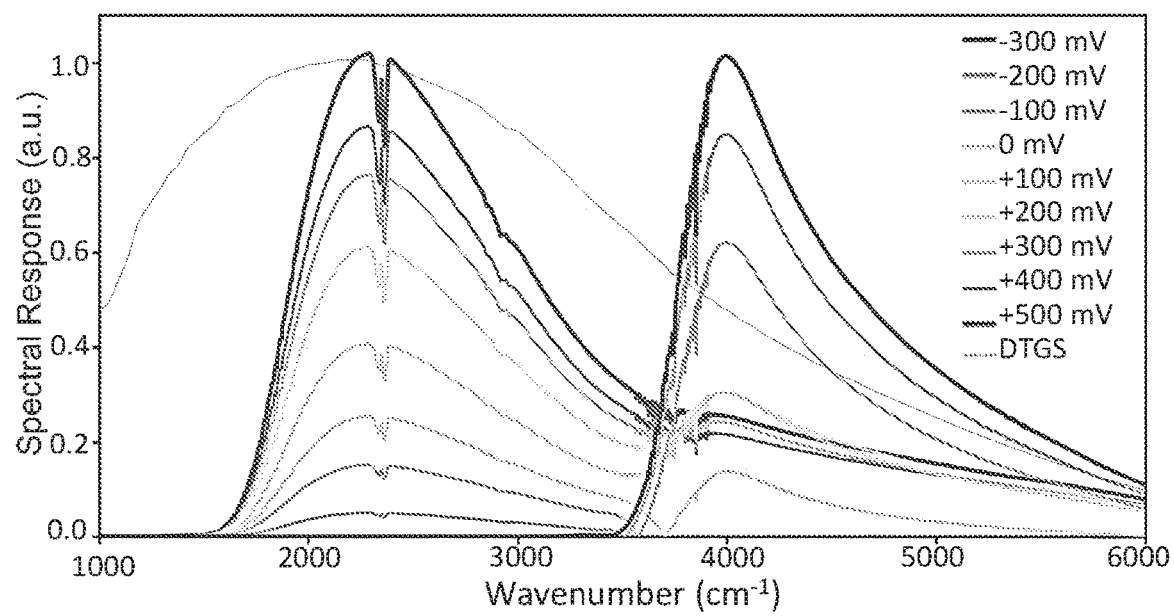

Using a 600° C. blackbody as light source, the IV curve of the dual-band detector was measured at cryogenic temperatures, as shown in FIG. 2A. The black line is the dark IV curve, and the dark current is suppressed for both positive and negative bias due to the "back-to-back" diode configuration. The solid line denotes the illuminated IV. To further verify the dual-band response, bias-dependent spectral responses were measured as shown in FIG. 2B. By changing the bias voltage from −300 mV to +500 mV, the spectral response gradually switches from SWIR mode to MWIR mode, in agreement with the proposed energy diagram (FIG. 1D). Mixed response, SWIR mode, and MWIR mode were all observed, depending on the polarity and magnitude of V$_{bs}$. Overall, D* above 10$^{10}$ Jones is achieved for both SWIR and MWIR detectors. Clearly, by optimizing the electron and hole doping, dual-band detectors with reliable, high-performance SWIR/MWIR response can be fabricated.

Figure 2C:
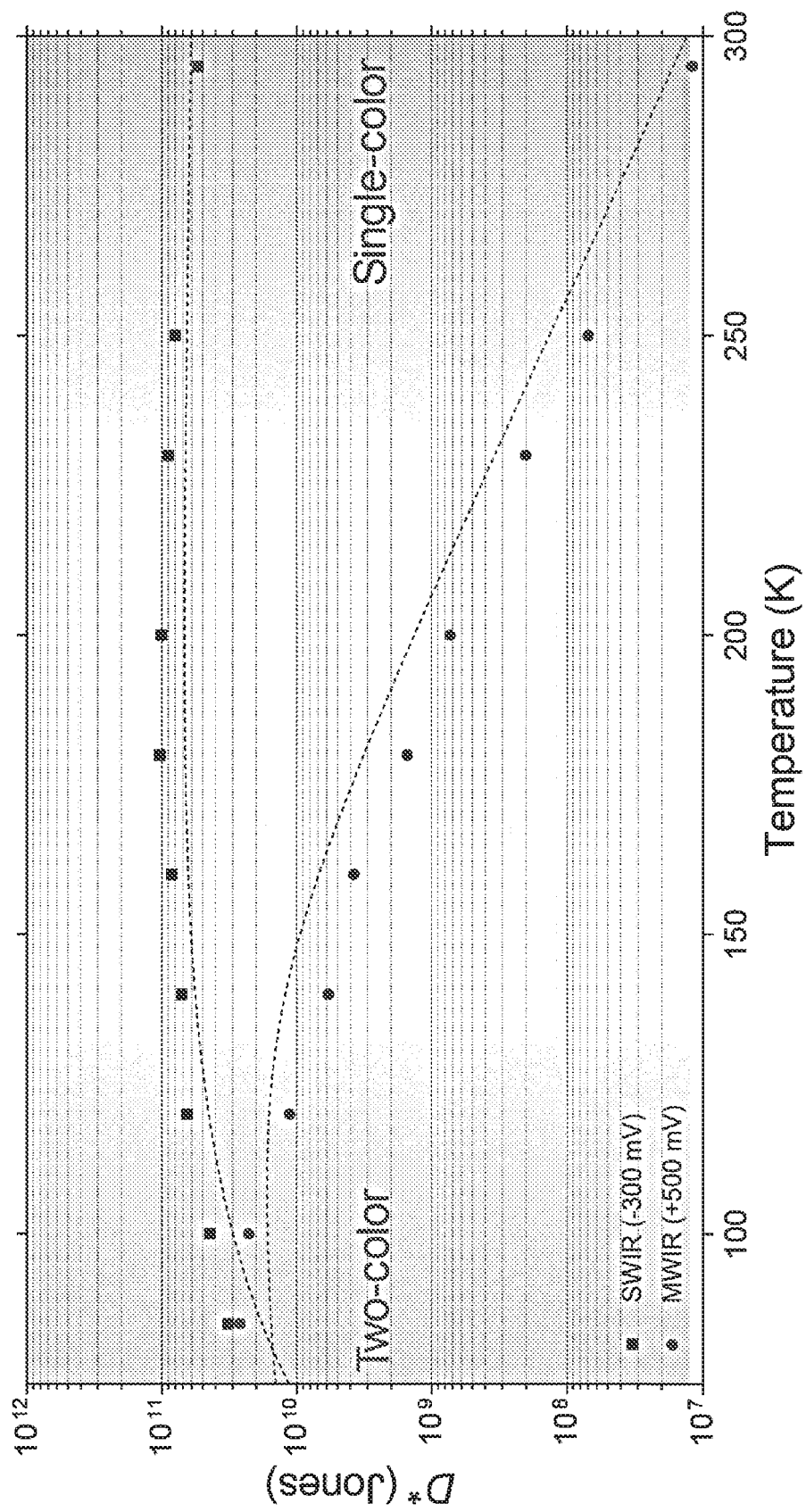
Figure 2D:
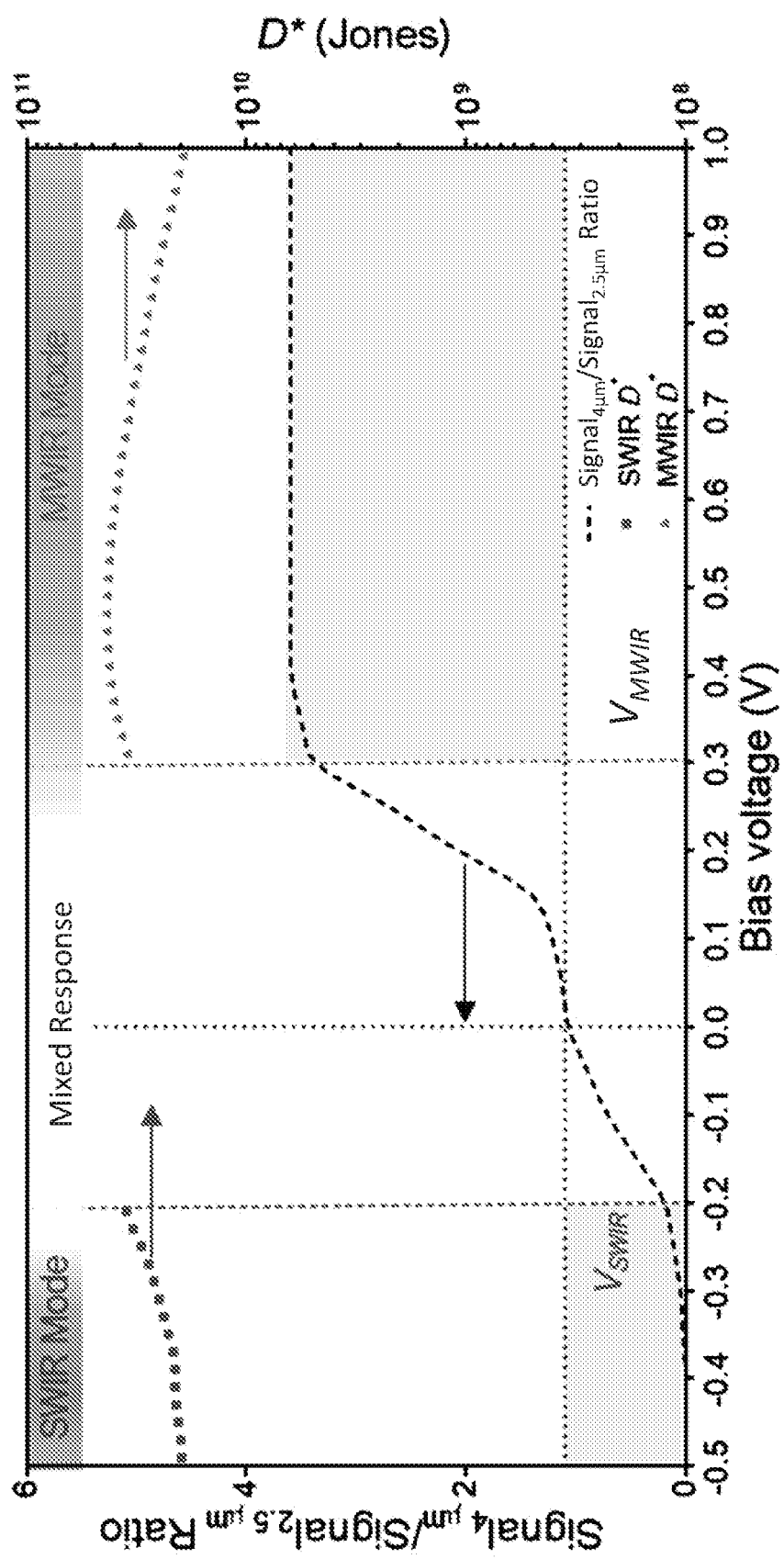

The performance of the dual-band detector was then characterized by measuring the temperature-dependent D* in both SWIR mode and MWIR mode, as shown in FIG. 2C. To turn off the MWIR and SWIR photodiode, bias voltages of −300 mV and +500 mV were applied respectively. Two distinct curves of temperature-dependent D* were observed, indicating that the SWIR photodiode or MWIR photodiodes were selectively activated. As the operation temperature increased from 85 K to 295K, the D* of the MWIR photodiode gradually decreased from 3×10$^{10}$ to 10$^7$ Jones, while the SWIR D* was less sensitive to temperature, varying between 3×10$^{10}$ and 10$^{11}$ Jones. Therefore, the dual-band detector changed from a two-color detector at low operation temperature to a single-color SWIR detector at room temperature. The spectral response at 295 K is shown in FIG. 2D. To provide some understanding of the D* of the different-sized HgTe CQDs, the D* of the HgTe CQDs photodiode is modeled as:

$$D^* = \frac{\sqrt{A \cdot \Delta f}}{I_n} \mathfrak{R} = \sqrt{\frac{A \cdot \Delta f}{4k_B T/R}} \cdot \frac{\alpha e}{h\nu} \eta \exp\left(\frac{-l}{l_D}\right)$$

where A is the sensing area, Δf is the bandwidth, I$_n$ is the noise spectral density, $\mathfrak{R}$ is the responsivity, R is the resistance of the diode, a is the absorption, e is elementary charge, hv is the photon energy, η is the quantum yield of charge separation, l is the thickness of CQDs film, and l$_D$ is the diffusion length.

The experimental results match well with the calculated D* (dashed lines in FIG. 2C). As the temperature drops and the thermally activated carrier density decreases, this leads to more resistive junctions. Therefore, the noise I$_n$ decreases for both SWIR and MWIR. However, the major difference between the SWIR and MWIR CQDs arises from the different roles that size has on the energy gap and the carrier mobility. The smaller SWIR HgTe CQDs have a larger energy barrier for hopping. This leads to a much faster decrease of the mobility with temperature, resulting in lower carrier collection efficiency and responsivity at low temperature. However, the thermal carrier density becomes smaller and the dark resistance remains high such that the D* from the SWIR diode does not change much with decreased temperature. On the other hand, the smaller gap of the MWIR HgTe CQD leads to a large decrease in thermal carrier density at low temperatures, while the mobility is not as strongly affected. This leads to an increase of both responsivity and junction resistance such that the D* is much improved at cryogenic temperatures.

Dual-Band Infrared Imaging

Figure 3:
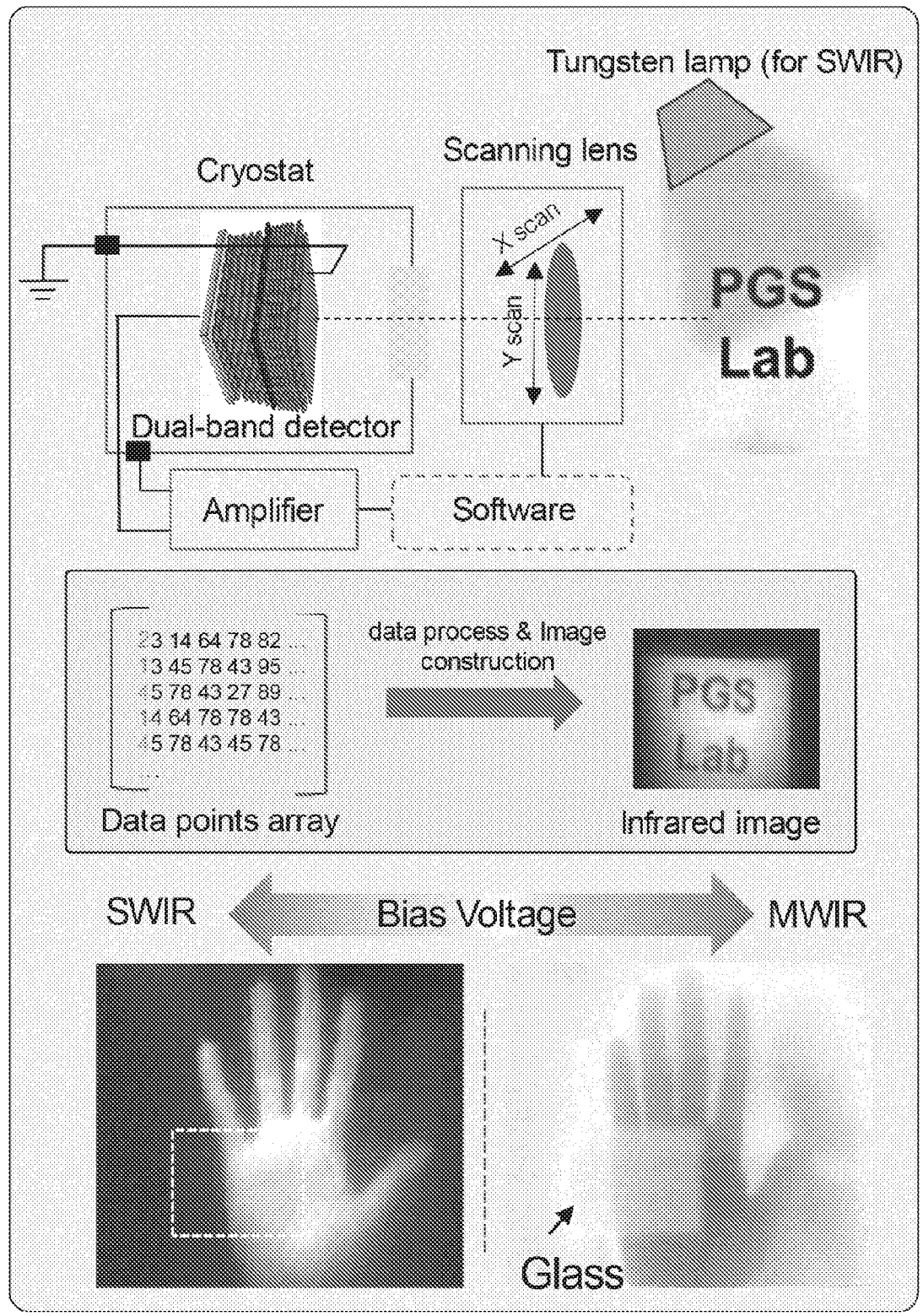
FIG. 3 depicts SWIR/MWIR dual-band imaging. The top panel shows an experimental setup of the dual-band detector imaging process. The bottom panel shows the MWIR and SWIR images of a hand behind glass.

As a visual demonstration of the dual-band detector, a single-pixel scanning imaging system was developed (FIG. 3). A BaF$_2$ lens was scanned to move the projected image over the dual-band detector. By switching the bias voltage, active SWIR imaging and passive MWIR imaging can be realized. Here, the word "active" means an external SWIR light source is needed, provided by a tungsten lamp. As shown in the bottom inset of FIG. 3, the MWIR image maps the thermally emitted light and provides the temperature distribution, while the SWIR image maps the reflected/scattered light from a tungsten lamp and gives a visible-like image with more information on the texture and details of the object. SWIR images can be taken at all temperatures, but cooling the detector to 85K is required to provide better quality MWIR images.

Comparisons were made between visible, SWIR, and MWIR images. The images illustrate that SWIR can see through objects that are opaque in the visible (silicon wafer) and MWIR (glasses). In addition, transparent solvents in visible images appear differently in the SWIR due to their vibrational absorptions. Therefore, as is well-known, SWIR and MWIR infrared images have great potential in wide applications like wafer inspection, chemical detection, and surveillance. More importantly, dual-band detectors can produce merged two-color images. For example, SWIR can be used to identify water samples, and MWIR can be used to determine which is hotter. It is clear that a merged two-color image is able to provide more information than the single-color images.

Switchable Dual-Band Sensing at High Frequency

Figure 4A:
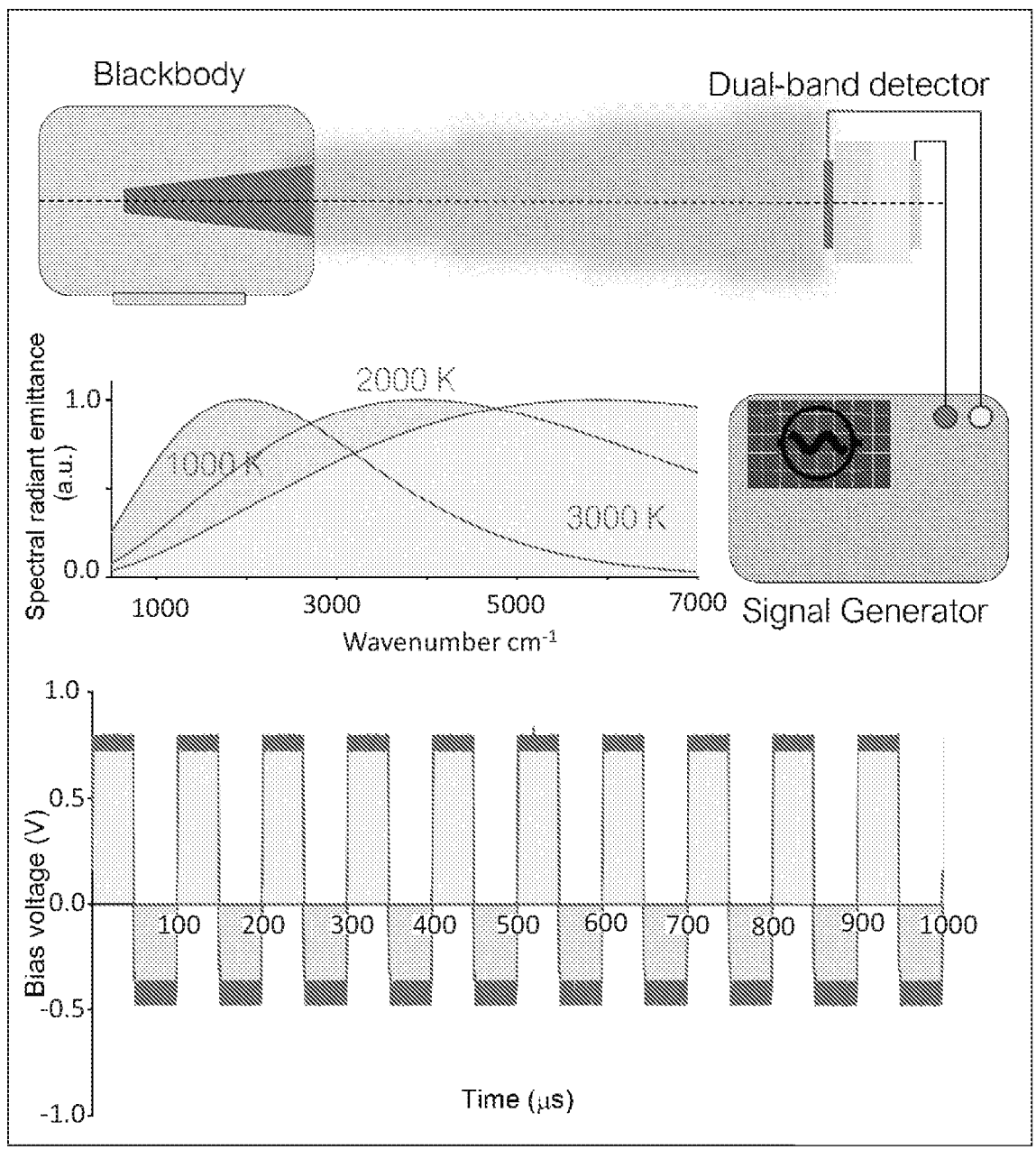
FIGS. 4A-4E depict bias-switchable SWIR/MWIR sensing with a HgTe CQDs dual-band detector.

Advantages of dual-band detection over single-band detection are manifold. Besides imaging, it is demonstrated herein that dual-band detection provides more reliable determination of the object temperature than single-band detection. By modulating the bias voltage, the SWIR and MWIR signals can be read sequentially during a short time interval. The experimental setup is shown in FIG. 4A. The dual-band detector was biased with a square waveform voltage at frequencies from 10 to 100 kHz. A calibrated blackbody was used as the light source (FIG. 4A, upper panel). By increasing the blackbody temperature, the optical power in the SWIR and MWIR bands changed as the emission peak moved towards shorter wavelength (FIG. 4A, middle panel). Therefore, the SWIR/MWIR signal ratio from the dual-band detector can be used to determine the object temperature. To obtain reliable SWIR and MWIR response, bias voltages alternating between +0.8V and −0.4 V were applied (FIG. 4A, lower panel).

Figure 4B:
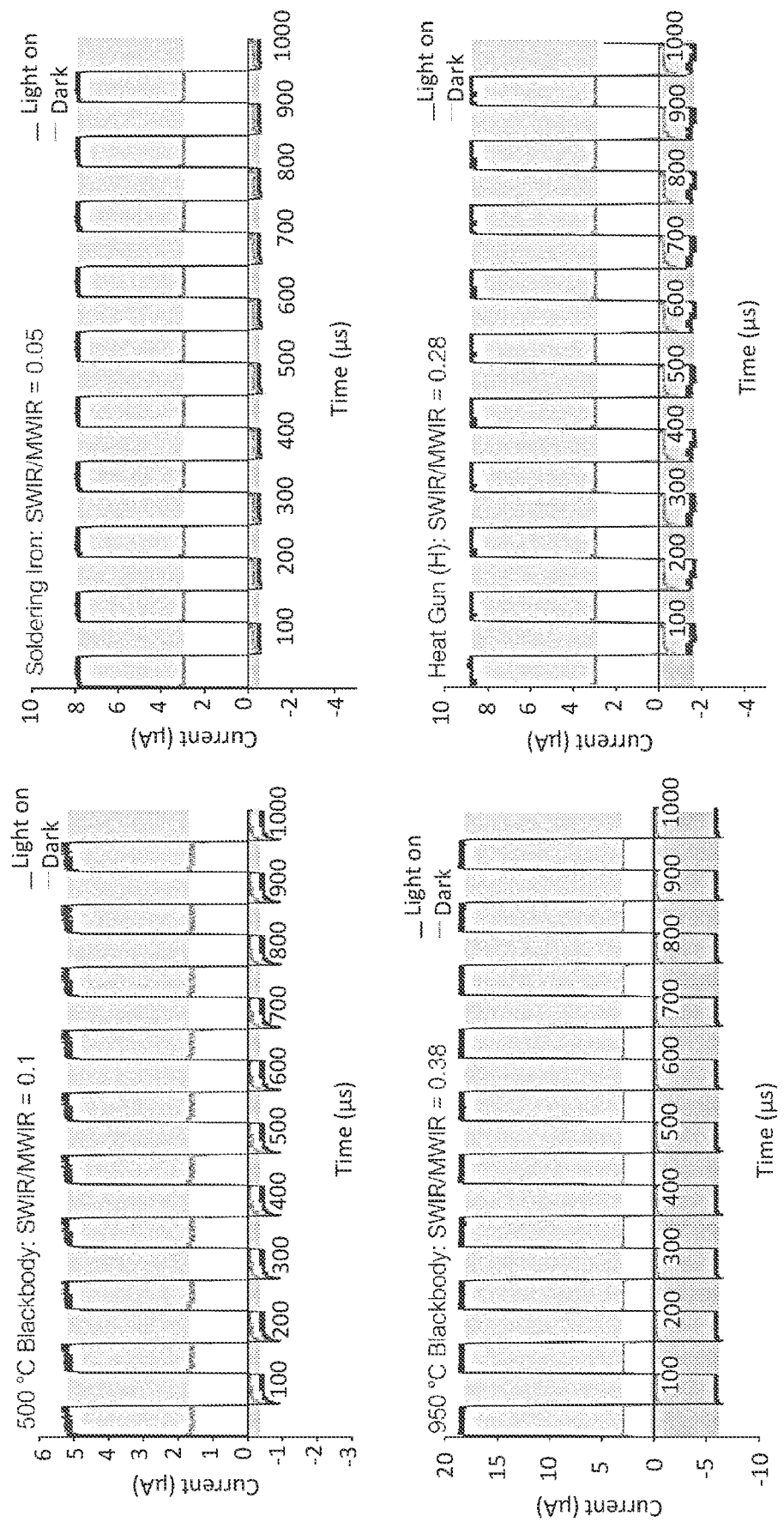
Figure 4C:
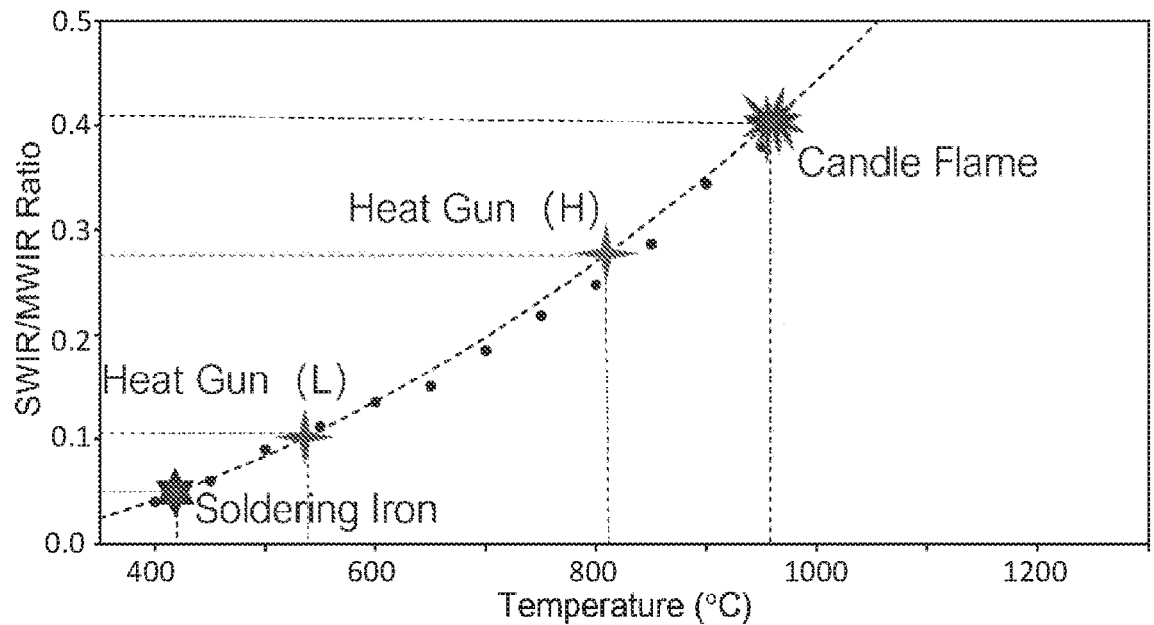

The representative square wave photoresponses are shown in FIG. 4B. The detector was operated at 10 kHz at 85K. Curves corresponding the currents with and without illumination are shown. The differently shaded areas denote the magnitude of MWIR and SWIR signals, from which the SWIR/MWIR ratio is calculated. As the blackbody temperature increased from 400 to 950° C., the SWIR/MWIR signal ratio increased from 0.04 to 0.38 accordingly (FIG. 4B, two left panels). The results confirmed that the SWIR/MWIR signal can be used to measure temperature. Using the blackbody response as reference, the temperature of hot objects, like a soldering iron (FIG. 4B, top right panel) and a heat gun (FIG. 4B, lower right panel), can be measured remotely (FIG. 4C). The measured temperature of a candle flame is lower than its actual value (~1300° C.), and this effect is known to be due to the higher emissivity of the flame at the $CO_2$ stretching vibration in the MWIR band.

Figure 4D:
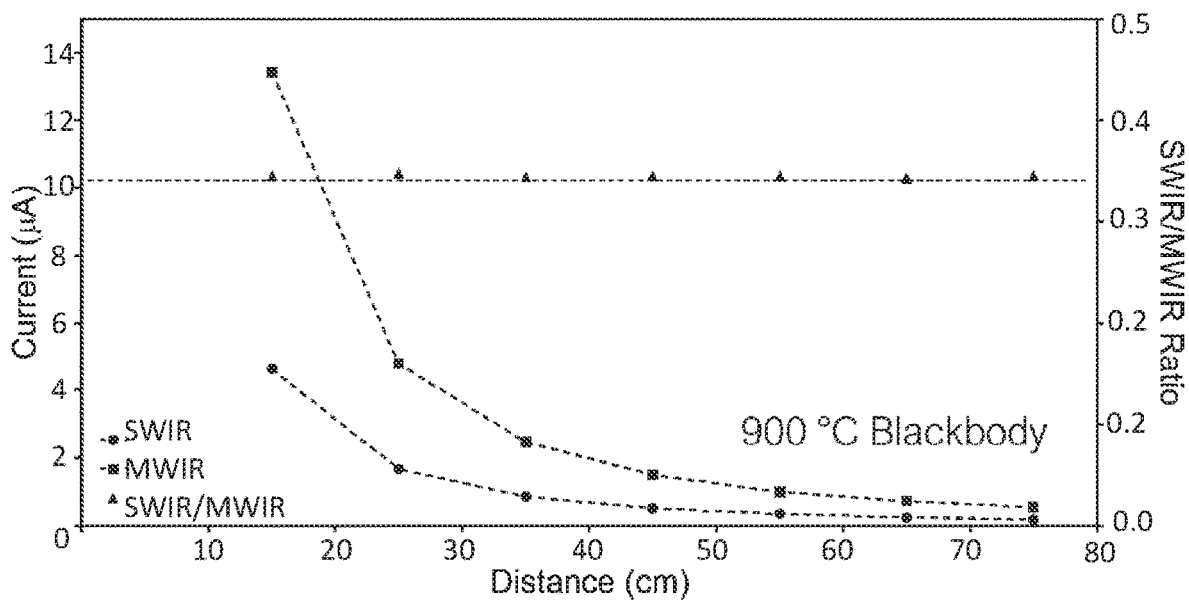

Dual band detection is also essential to measure temperature accurately when the background temperature in unknown. Indeed, in a single detector, a temperature reading requires a stable calibration with respect to a known background temperature or a shutter at a known temperature. In a dual band detector, the SWIR/MWIR signal ratio is independent of the optical power or distance between the detector and the measured object. This is shown in FIG. 4D, highlighting the fact that the dual-band detector can be used for absolute and remote temperature measurement.

Figure 4E:
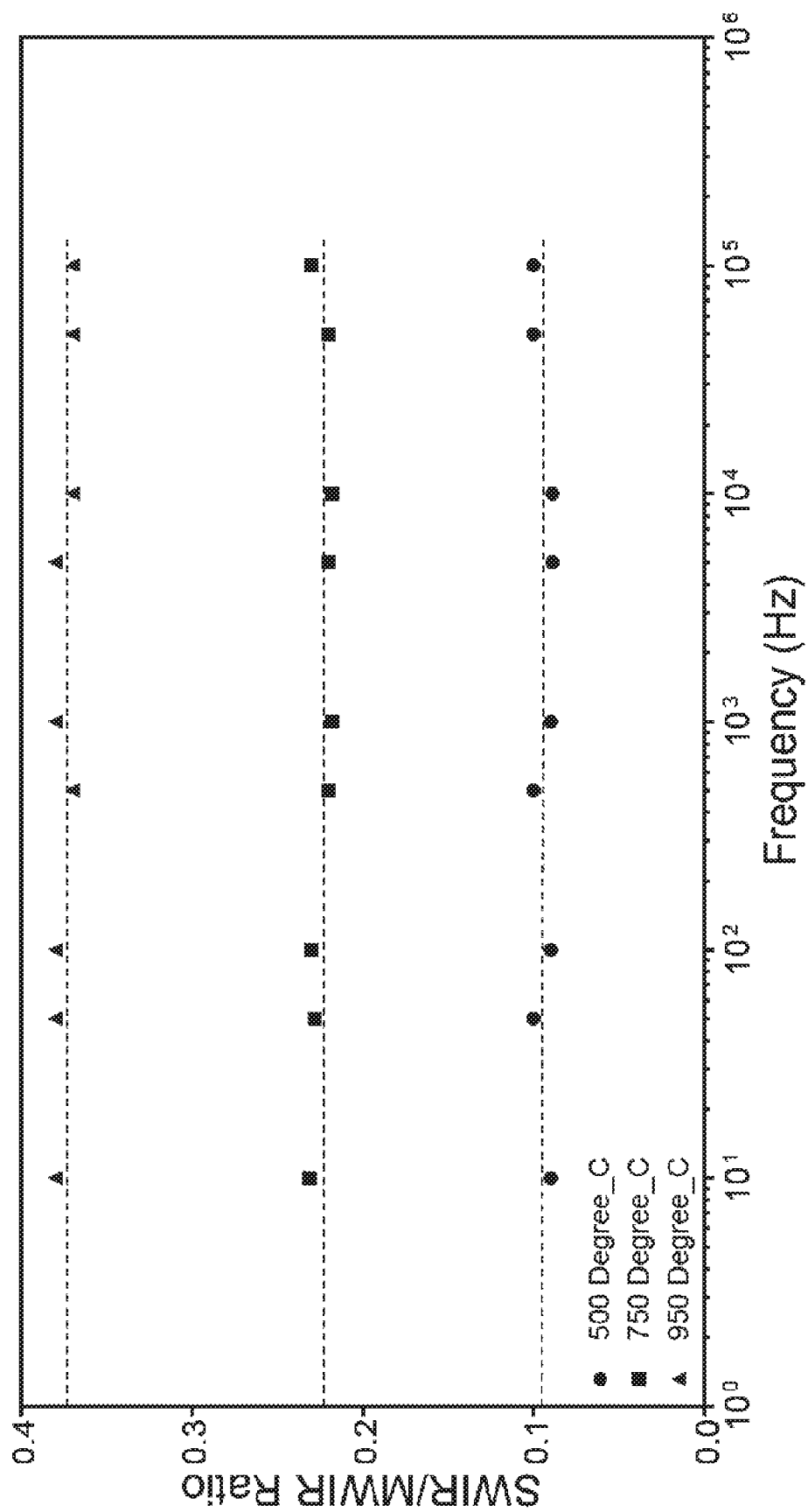

As shown in FIG. 4E, the dual-band detector operates up to 100 kHz without changes in the SWIR/MWIR ratio. The response time is <2.5 μs, which is limited by the amplifier ($f_{cut-off}$=500 kHz). During the measurements, the dual-band detector went through ~200 million times switching cycles (operation time×frequency) without changes in dark current, signal noise, and responsivity, demonstrating the high stability of the device performance. Moreover, the HgTe CQD films are compatible with cleanroom microfabrication techniques, and pixelated HgTe CQDs films could be fabricated with small pitches (FIGS. 5A and 5B). The HgTe CQD detectors are therefore a route to low-cost, fast, and high-resolution dual-band infrared imaging cameras.

Methods

Synthesis of Colloidal Materials

The synthesis of HgTe CQDs and $Ag_2Te$ nanocrystals are similar to those reported in Ackerman, et al. (Ackerman, M. M. et al., *ACS Nano* 12, 7264-7271 (2018).). For HgTe CQDs, $HgCl_2$ (0.15 mmol) was dissolved in 4 g of oleylamine in a 20 mL glass vial at 100° C. for 30 min with stirring in a glovebox. The temperature was then adjusted to the reaction temperature and stabilized for 30 min. Tellurium in trioctylphosphine (TOP) solution (1 M, 0.15 mL) was rapidly injected. The clear solution immediately turned black. The reaction temperature and reaction time depend on the target size of HgTe CQDs. In this example, 95~100° C. for 10 min and 75~80° C. for 5 min were typical conditions for MWIR and SWIR HgTe CQDs. The reaction was quenched by injecting a solution of 0.4 mL dodecanethiol (DDT) and 0.16 mL TOP in 4 mL tetrachloroethylene (TCE). After quenching, the vial was quickly removed from the glovebox and cooled. For film preparation, ~2 mL of crude solution was removed and diluted with 2 mL of TCE, 0.3 mL of TOP, and 0.3 mL of DDT. The solution was precipitated with an equal volume of isopropanol (IPA) and centrifuged at 4500 rpm for 2 min. Finally, the precipitate was resuspended in 4 mL of chlorobenzene and stored in ambient conditions.

In an alternative HgTe CQD synthesis, bis-(trimethylsilyl) telluride (TMSTe) was used to initially synthesize spherical HgTe quantum dots according to the methods described in Shen et al., *The Journal of Physical Chemistry Letters* (2017), 8, 10, 2224-2228, the entirety of which is incorporated herein by reference. The HgTe quantum dots made using TMSTe tend to be better separated but more spherical than HgTe CQDs synthesized using the method above. The spherical HgTe CQDs from this initial synthesis were then reacted with similar molar amounts of TOP telluride (TOPTe) that was added to the solution. This has the effect of retaining the improved size dispersion and separation, while converting the quantum dots to a more tetrahedral shape, which is reflected in their absorption and photoluminescence spectra; a strong narrowing was evident in the spectra, relative to that of HgTe CQDs made using only TMSTe, and a noticeable narrowing was evident in the spectra, relative to that of the HgTe CQDs made with only TOPTe.

For $Ag_2Te$ nanocrystals, silver (I) nitrate ($AgNO_3$, 34 mg, 0.2 mmol) was dissolved in oleylamine (OAm, 5 mL) with oleic acid (OA, 0.5 mL) for 30 minutes with stirring at 70° C. in a nitrogen glovebox. Once dissolved, trioctylphosphine (TOP, 0.5 mL) was injected, and the clear solution was heated rapidly to 160° C. The solution began to turn yellow at temperatures above 140° C. and was kept at 160° C. for 35-45 minutes until it was orange colored. A separate solution of TOP telluride (TOPTe, 1 M) was prepared by dissolving Te pellets in TOP at 150° C. for 1-2 hours, or until dissolved, and then cooled to room temperature. TOPTe (0.1 mL, 0.1 mmol) was injected to the reaction solution. The solution immediately turned from orange to black, and the reaction time was 10 minutes. Then, the reaction mixture was removed, cooled, and stored in a freezer (−8° C.) until required. For $Bi_2Se_3$, 0.1 mmol (40 mg) bismuth (III) acetate and 5 mL of oleic acid (OA) was added into a 20 mL vial.

The solution was moved to a glovebox and stirred at 100° C. for 1 hr to form a clear solution. A solution of selenium precursor was prepared by dissolving 2 mmol (246 mg) selenourea in 10 mL of oleylamine at 100° C. to form a transparent, orange-colored stock solution, which was stored in the glovebox. 0.15 mmol (0.75 mL) of the stock selenourea solution was rapidly injected to the bismuth solution. The clear solution immediately turned black, and the reaction proceeded for ~1.5 min before being removed from the hotplate. The black solution was removed from the glovebox, cooled in a water bath, precipitated with acetone, then centrifuged at 4500 rpm for 5 minutes. The supernatant was removed, and the black precipitate was dispersed in 4 mL of chlorobenzene. Stock solutions appeared brown to purple in color and were colloidally stable for ~1 month under ambient conditions.

Prior to being drop-casted, the HgTe CQDs and Ag$_2$Te nanocrystal solutions were cleaned a second time. 200 µL of HgTe CQDs was precipitated with 50 µL of 0.1 M didodecyldimethylammonium in IPA. The HgTe CQDs was centrifuged and resuspended in 40 µL of chlorobenzene and 160 µL of butyl acetate. For the Ag$_2$Te nanocrystals, 200 µL of crude solution was precipitated with methanol and centrifuged. After removing the supernatant, 50 µL of DDT and 150 µL of chlorobenzene were added to resuspend the solid. Cleaning with methanol was repeated twice more, dissolving in chlorobenzene between cleanings. Finally, the Ag$_2$Te nanocrystals were suspended in 400 µL of 9:1 hexane/octane.

Device fabrication. The fabrication of the dual-band detectors started with sputtering 30 nm ITO on a 0.5 mm thick sapphire substrate, followed by 300° C. annealing on a hotplate for 10 min. Before drop-casting the colloidal solutions, the substrate was treated with 3-mercaptopropyltrimethoxysilane (MPTS) for 30 s and rinsed with IPA. The dual-band detector was then fabricated by sequential depositions of colloidal materials. A Bi$_2$Se$_3$ solution was first spin-coated on the ITO substrate as the n-type layer. The spin-coating of Bi$_2$Se$_3$ was repeated twice followed by cross-linking with 5% ethanedithiol (EDT) in IPA. Second, the MWIR HgTe CQDs solution was drop-casted to build up a ~400 nm film. Each drop-cast layer was cross-linked by EDT/HCl/IPA (1:1:20 by volume) solution for 20 s, rinsed with IPA, and dried. An Ag$_2$Te nanocrystal solution was spin-coated on the MWIR HgTe CQD film asp-dopant and treated with HgCl$_2$ (10 mM in methanol) for 10 s. A second layer of Ag$_2$Te nanocrystals was added by spin-coating without HgCl$_2$ treatment followed by drop-casting one layer of SWIR HgTe CQDs. The Ag$_2$Te nanocrystals/SWIR HgTe CQDs layers were then treated with HgCl$_2$ solution together. The drop-casting of the SWIR HgTe CQDs was then repeated to make ~400 nm film, and each layer was cross-linked by EdT/HCl/IPA (1:1:20 by volume). Finally, the Bi$_2$Se$_3$ solution was spin-coated on the SWIR HgTe CQDs twice and cross-linked by 5% EDT in IPA. Finally, 5 nm Au was deposited by e-beam evaporation as the top contact. The sensing area of the detector was determined by the overlapping area between ITO and the Au contact. In the experiments, ~1 mm$^2$ area dual-band detectors were used in the IV measurement, spectral response measurement, D* measurement, and switchable SWIR/MWIR sensing. The single-pixel imaging was done with 0.2×0.2 mm$^2$ area detectors.

Single-pixel scanning imaging system. A scanning camera system was developed with a single detector of 0.2×0.2 mm$^2$ area. The imaging system consisted of five parts: scanning lens, cryostat, HgTe detector, amplifier, and software. Controlled by the software, a BaF$_2$ lens (f=30 mm, LA0583-E, Thorlabs) was scanned over a 15 mm×15 mm$^2$ area. Two linear motorized stages (X-axis: ELL7K, Thorlabs, and Y-axis: PT1-Z8, Thorlabs) were used to scan the lens. As the projected image of the object moved over the detector, the photocurrent was amplified and sampled by the software at 3 kHz sampling rate. The recorded data array was then used to construct images. The number of points in the vertical and horizontal directions was 75 and 500, respectively. For SWIR imaging, a 75 W tungsten lamp was used as the light source, and it was placed ~40 cm away from the objects.

Switchable dual-band sensing. The dual-band detector was biased by a function-generator (33220A, Agilent), and the current was amplified by a current amplifier (DLPCA-200, Femto) at a gain of 10$^4$V/A (Bandwidth 500 kHz). The noise was measured using a spectrum analyzer as reported in prior work. (Ackerman, M. M. et al., (2018) and Tang, X. et al., *ACS Nano* 12, 7362-7370 (2018).) The SWIR/MWIR signal ratio was recorded when the detector was exposed to objects with different temperatures.

Example 2: Single-Band MWIR Photodetector

This example illustrates the fabrication and operation of a single-band HgTe CQD-based MWIR photodetector.

Methods

HgTe Colloidal Quantum Dot Synthesis. HgTe CQDs were synthesized according to a previously reported procedure with slight modifications. (Keuleyan et al., *ACS Nano* 2014, 8, 8676-8682.) HgCl$_2$ (0.15 mmol) was dissolved in 4 g of oleylamine in a 20 mL glass vial. The solution was moved to a glovebox. To dissolve the HgCl$_2$, the solution was heated at 100° C. for 30 min with stirring. The temperature was reduced to 97° C., and tellurium in trioctylphosphine solution (1 M, 0.15 mL) was rapidly injected. The clear solution turned immediately black. The reaction proceeded for 10 min. The vial was quickly removed from the glovebox and cooled. For film preparation, ~2 mL was removed and diluted with 2 mL of tetrachloroethylene, 0.3 mL of trioctylphosphine (TOP), and 0.3 mL of 1-dodecanethiol. The solution was precipitated with an equal volume of IPA and centrifuged. The precipitate was not allowed to completely dry and was resuspended in 4 mL of chlorobenzene. The solution was stored in ambient conditions. Prior to being drop-casted, the HgTe solution was cleaned a second time by adding dropwise a 0.1 M didodecyldimethylammonium bromide solution to 200 µL of HgTe solution until lightly turbid. The HgTe was centrifuged and resuspended in 40 µL of chlorobenzene and 160 µL of butyl acetate. Sonication was sometimes required to obtain a neat colloid. Aggregation should be avoided to prepare the highest-quality films.

Ag$_2$Te Colloidal Quantum Dot Synthesis. Ag$_2$Te CQDs were fabricated in a glovebox by heating 4 g of oleylamine in a 20 mL glass vial with stirring at 160° C. The Ag precursor was prepared by dissolving 170 mg of AgNO$_3$ in 5 mL of trioctylphosphine and 5 mL of oleic acid at 120° C. with stirring in a glass vial in a nitrogen glovebox. The precursor was cooled to room temperature before use. A 1 mL aliquot of the Ag precursor (0.1 M) was rapidly injected into the vial followed by a rapid injection of 0.075 mL of TOPTe (1 M). The solution turned orange after injection of the Ag precursor and immediately black after TOPTe injection. The reaction proceeded for 10 min, and the vial was removed from the glovebox to cool. The crude solution was stored in a freezer at −8° C. and required thawing before use. Prior to spin-coating, 200 µL of crude solution was precipitated with methanol and centrifuged for 1 min at 4200 rpm.

After the supernatant was removed, 50 µL of 1-dodecanethiol and 150 µL of chlorobenzene were added to resuspend the solid. Cleaning with methanol was repeated twice more, dissolving in chlorobenzene between cleanings. Finally, the Ag$_2$Te CQDs were suspended in 400 µL of 9:1 hexane/octane with a typical concentration of 12.5 mg/mL.

Fabrication of Photodetectors. Sapphire substrates were cut from a 2 in. wafer into 0.5 in.×0.5 in. pieces. ITO (50 nm) was sputtered over the substrate at $10^{-8}$ Torr. The area of the ITO electrode was defined by photolithography followed by etching. The ITO was annealed at 300° C. in a quartz tube furnace for 3 h with a final resistance of ca. 50 Ω/square. Before use, the ITO was cleaned by sonication for 10 min in a 1% Alconox solution, acetone, and IPA and rinsed with DI water and then dried with N$_2$ gas. The substrate was then treated with 3-mercaptopropyltrimethoxysilane for 30 s and rinsed with IPA. With a glass Pasteur pipet, 2 drops of HgTe (~30 µL) were delivered to the substrate and heated to 40° C. The solution was spread over the surface by slowly tilting the substrate in a circular motion before wicking. The dry HgTe film was immersed in an EdT/HCl/IPA (1:1:20 by volume) solution for 20 s, rinsed with IPA, and dried. This process was repeated 5-7 times to build up a device with a thickness of ~400 nm. From a glass Pasteur pipet, 2 drops of the Ag$_2$Te solution were delivered to the substrate and spun at 2000 rpm for 30 s. HgCl$_2$ solution (10 mM in methanol) was delivered and spun off after 10 s, followed by rinsing with IPA. A second layer was added by the same procedure for a ~30 nm thick film. Finally, the device was treated with 2% (v/v) EdT/IPA solution and rinsed with IPA. The Au electrode was evaporated at $10^{-8}$ Torr by electron beam at a rate of 1.0 Å/s.

Figure 6A:
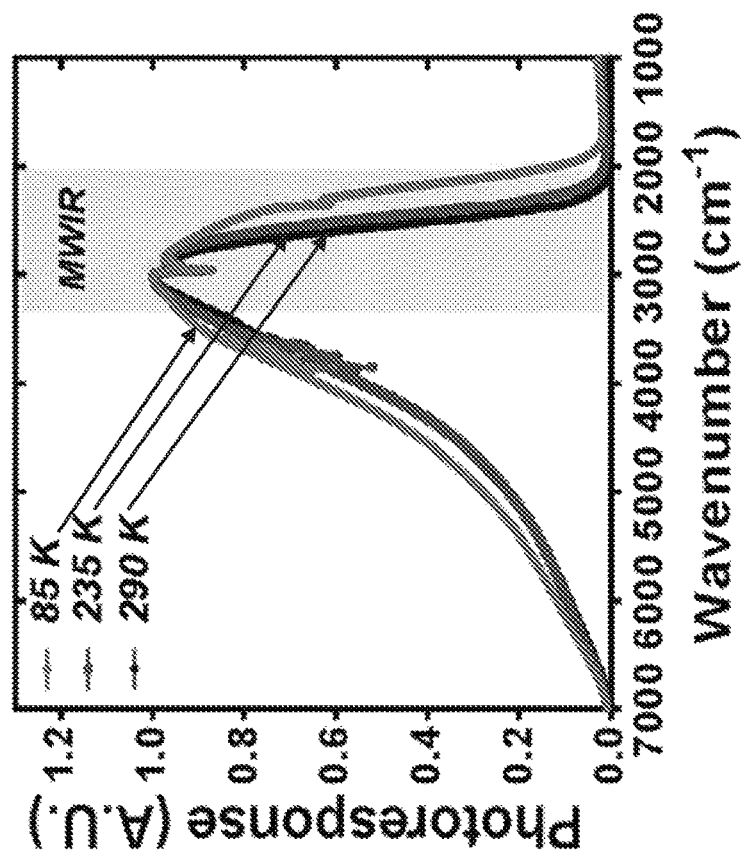
FIGS. 6A-6D show performance of the HgCl$_2$-treated HgTe CQDs MWIR detectors.
Figure 6B:
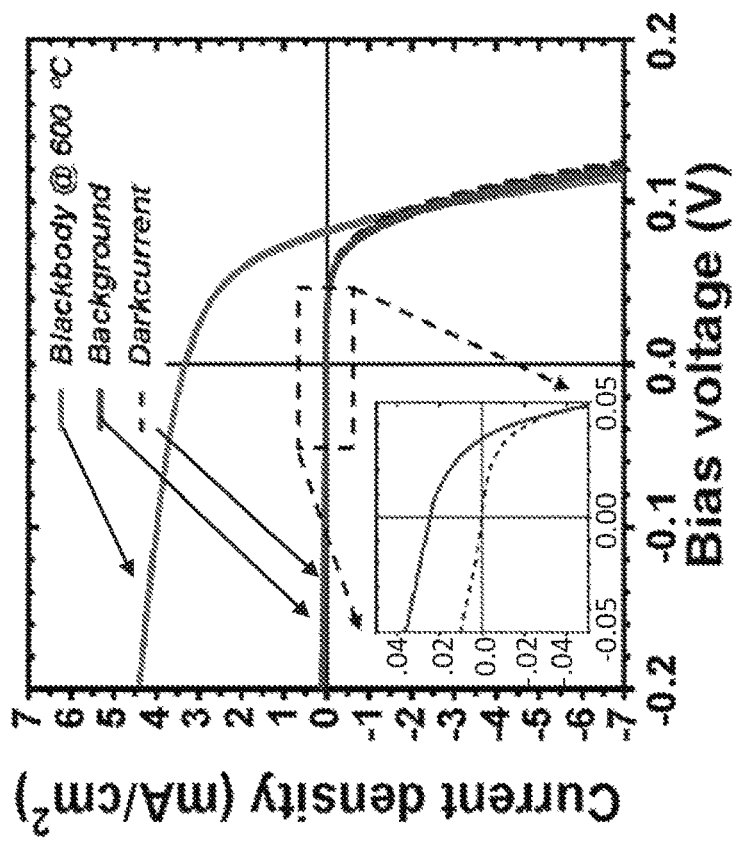

Determination of Device Characteristics. The detector characterization methods are similar to those reported in Guyot-Sionnest, 2015. Samples were placed in a closed-cycle cryostat for temperature-dependent characterization. A transimpedance amplifier and low-noise preamplifier were used to measure the current from the device. The responsivity was measured with a calibrated blackbody source at 600° C. The sample was placed 15±1 cm away, and light was chopped at 500 Hz. The detector area, source area, and spectral radiance of the blackbody were used to determine the photon flux on the detector. The photocurrent spectra were directly measured with a scanning FTIR and are as shown in FIG. 6B. The spectra can be normalized to the DTGS internal detector of the FTIR with a frequency correction to account for the slow DTGS speed. This corrects for the source blackbody spectrum as well as the optics of the instrument. Such spectra are shown in FIG. 9B. The cutoff wavelength was taken as the ½ point of the low-energy rising edge. The number of photons arriving on the detector area with an energy above that cutoff was calculated with a correction for the cryostat window transmission (CaF$_2$ or ZnSe). The responsivity in A/W was determined using the photon flux above the cutoff energy times the cutoff photon energy. The noise at short-circuit and 500 Hz was measured with a spectrum analyzer, whereas the blackbody source was blocked, and the cold shield was closed to the sample at low temperatures. The specific detectivity was determined using the responsivity, noise, and device area as measured under an optical microscope.

Current-Voltage and Capacitance-Voltage Measurement. A function generator was used to apply an alternating voltage to the sample for both current-voltage and capacitance-voltage measurements. For current-voltage measurements, a linear ramp with a frequency of 50 mHz and amplitude of 200 mV was applied to the sample. Capacitance-voltage measurements were performed using a sinusoidal wave with a fixed peak-to-peak voltage of 10 mV. The frequency was varied from 1 to 20 kHz while the current was recorded. A DC voltage offset was set by the frequency generator and applied for reverse-bias capacitance measurements.

Results

The detectors were characterized between 85 and 295 K, under vacuum in a cryostat. A typical current density-bias voltage (J-V) curve of the HgCl$_2$-treated HgTe CQDs MWIR detector at an operation temperature of 85 K is shown in FIG. 6A. The devices exhibit background-limited infrared performance (BLIP) up to 140 K. Under illumination with a calibrated 600° C. blackbody and operating temperature of 85 K, the responsivity (in units of A W$^{-1}$)

$$\mathcal{R} = S/P \quad (1)$$

and specific detectivity were $\mathcal{R}=0.38$ A/W and D*=1.2× 10$^{11}$ Jones, respectively. The detector showed temperature-dependent cutoff wavelength from 3.8 µm at 290 K to 4.8 µm at 85 K, covering the MWIR range, as shown in FIG. 6B.

Figure 6D:
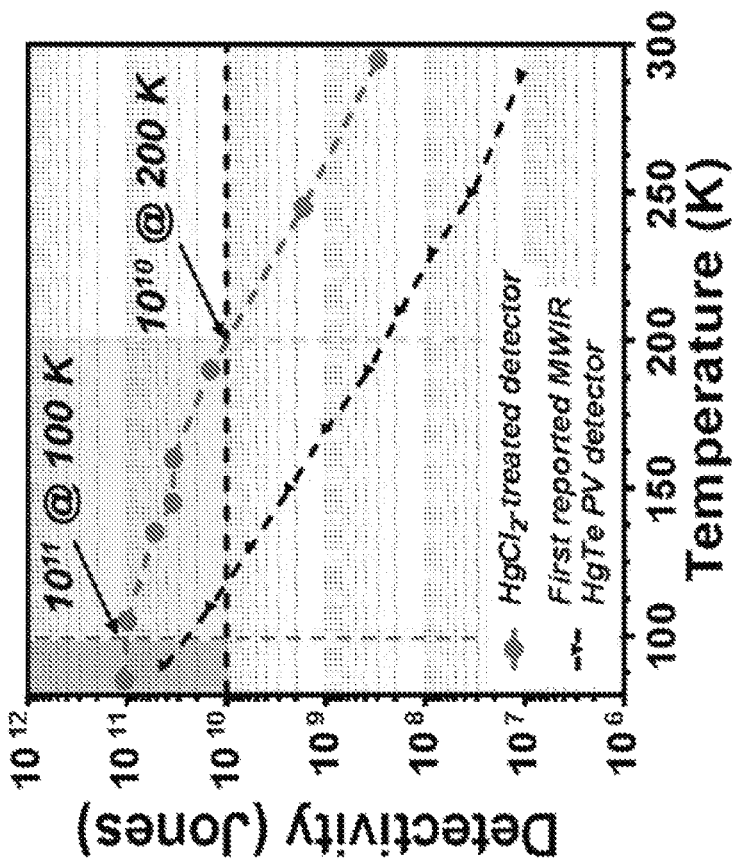
Figure 6C:
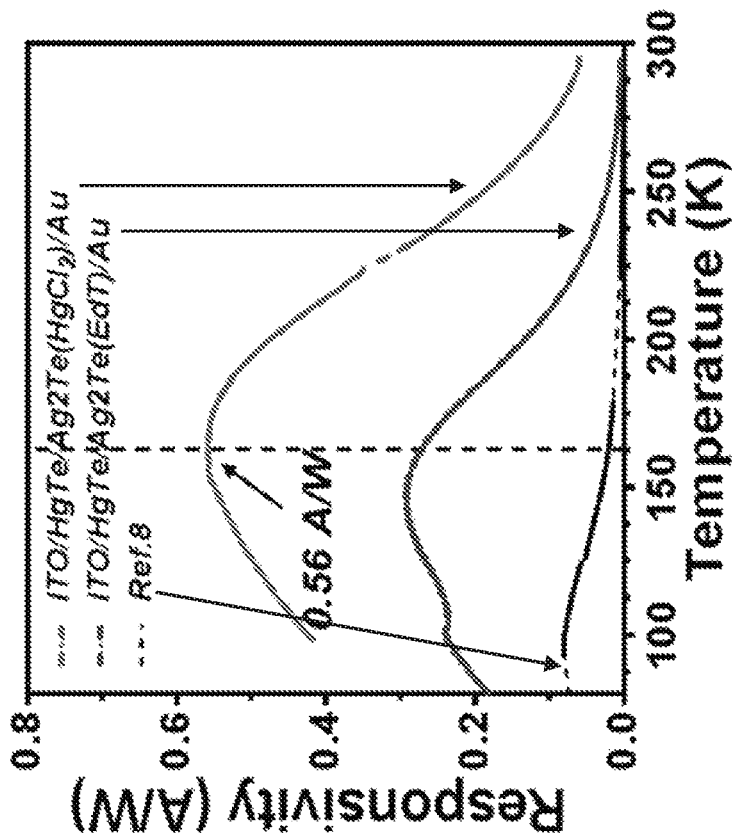

The temperature-dependent responsivity is shown in FIG. 6C. The peak responsivity of 0.56 A/W at 160 K is about 7-fold larger than that in previously reported HgTe CQDs PV MWIR detectors. (Guyot-Sionnest, 2015.) The temperature-dependent D* is shown in FIG. 6D. Below 100 K, D* exceeds 10$^{11}$ Jones, and D* is 10$^{10}$ Jones at 200 K. At 230 K, where thermoelectric cooling is practical, D* is 10$^9$ Jones. The D* of previously reported HgTe CQDs MWIR detectors without HgCl$_2$ treatment is also shown for comparison.

Figure 7A:
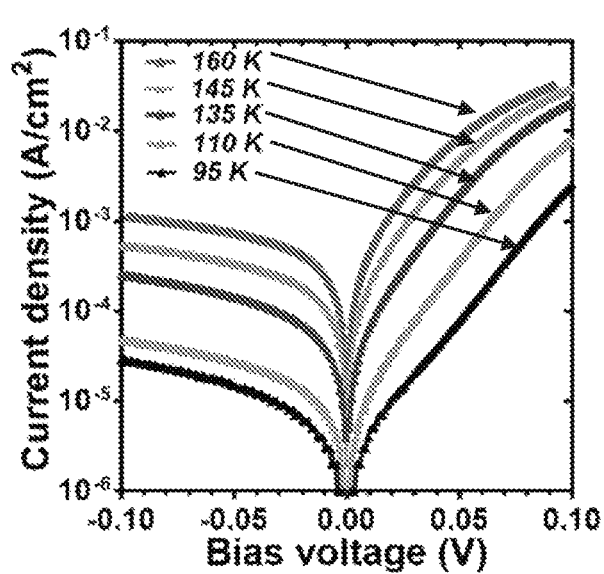
FIGS. 7A-7C depict characterization of dark current and open-circuit voltage.
Figure 7B:
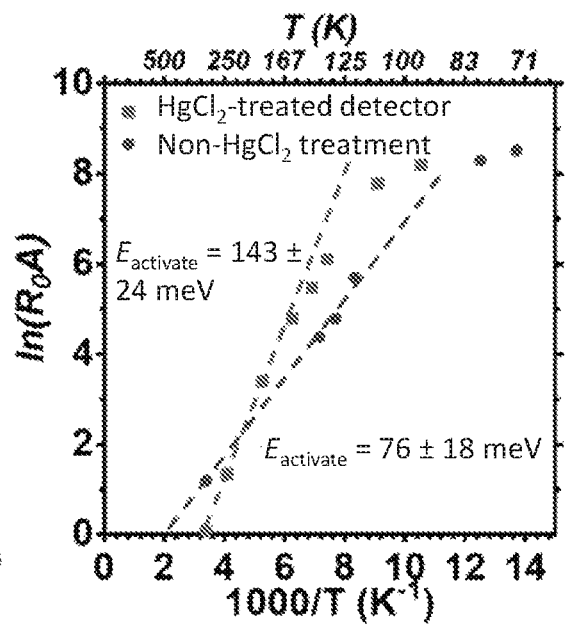

To further characterize the electrical properties of the devices, the temperature-dependent dark currents were measured (FIG. 7A) and fitted to a modified Shockley diode equation:

$$I = I_0\left[\exp\left(\frac{e(V - R_s I)}{nk_B T}\right) - 1\right] + \frac{V - R_s I}{R_0} \quad (2)$$

where $I_0$ is the reverse saturation current, e is the elementary charge, $R_s$ is the series resistance, n is the ideality factor, V is the external voltage, T is the operation temperature, $k_B$ is the Boltzmann constant, and $R_0$ is the shunt resistance. The temperature dependence of the $R_0A$ product is shown in FIG. 7B. Activation energies, $E_A$, of 143±24 and 76±18 meV for HgCl$_2$-treated and untreated devices, respectively, were obtained from linear regression of the data between 200 and 300 K. Typically, the dark current mechanism in a MWIR photodiode is dominated by either diffusion of minority carriers across the depletion region or generation—recombination of thermally generated carriers within the depletion region; the former varies as $1/n_i^2$ and the latter as $1/n_i$, where $n_i \propto \exp$ $$\left(-\frac{E_g}{2k_B T}\right)$$

is the intrinsic carrier concentration and $E_g$ is the band gap. Because $E_A$ is approximately half the band gap (0.25<$E_g$<0.3 eV), the HgCl$_2$-treated device appears dominated by a generation-recombination current at high temperatures. At temperatures below 70 K, for both the HgCl$_2$-treated and untreated devices, the $R_0A$ product becomes weakly temperature-dependent. This is attributed to leakage currents and nonradiative pathways.

Figure 7C:
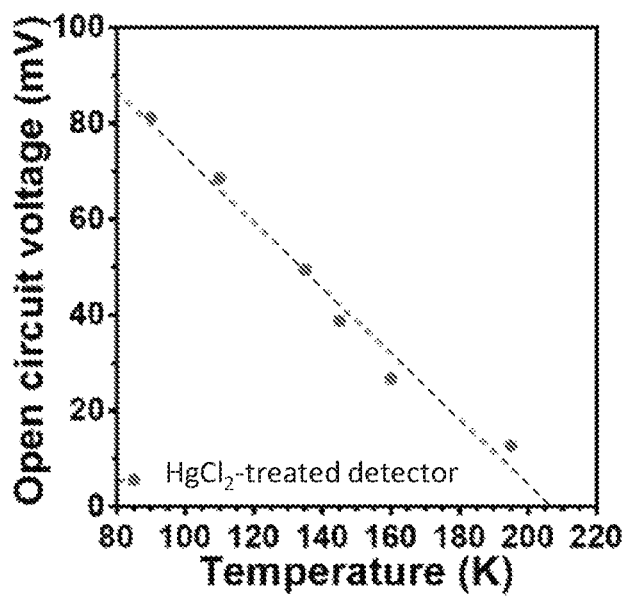

For an ideal p-n junction, $V_{oc}$ should be equivalent to $E_g$ at low temperature with a linear decrease with temperature given by $$V_{OC} = \frac{E_g}{e} - \frac{k_B T}{e} \ln\left(\frac{N_c N_v}{np}\right) \quad (3)$$

where $N_c$ ($N_v$) is the conduction band (valence band) density of states and n (p) is the electron (hole) concentration. A linear relationship between the operation temperature T and the open-circuit voltage $V_{oc}$ is indeed observed, as shown in FIG. 7C. The maximum $V_{oc}$ is, however, less than the CQD gap of $E_g$~0.25 eV, and this open-circuit voltage deficit is attributed to energy disorder that broadens the density of states as well as nonradiative processes. For the device in FIG. 7C, eq 3 gives ln $$\left(\frac{N_c N_v}{np}\right) \sim 7.7,$$

calculated from the slope. Using $N_c \sim N_v \sim 2$ |e|/dot and assuming n~p, this indicates a doping of n~p~0.04 |e|/dot, or ~2.0±0.5×10$^{17}$ cm$^{-3}$ for a CQD tetrahedron with a 10-12 nm edge and a volume packing fraction of 0.5-0.7. A slope of zero corresponds to $N_c N_v \sim np$, which is the maximum doping, and is required for temperature-independent $V_{oc}$. This suggests that increased doping at the junction will further improve device performance at higher operating temperatures.

Figure 8A:
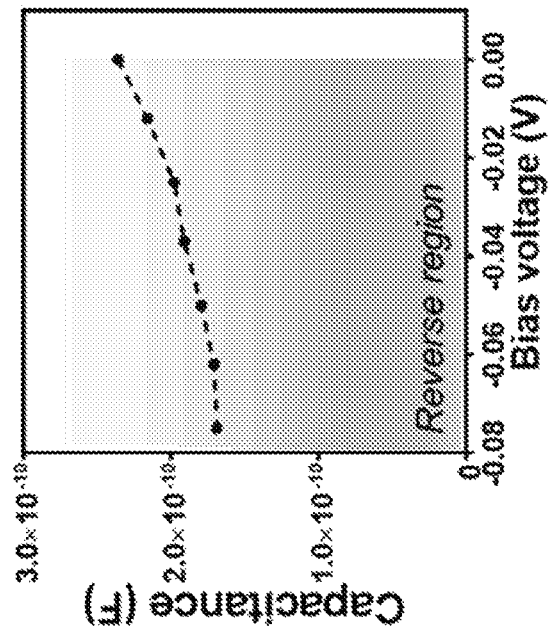
FIGS. 8A-8D depict capacitance-voltage and Mott-Schottky analysis of a HgTe CQD photodetector.

Capacitance-voltage (CV) measurements are shown in FIGS. 8A-8D. A 10 mV AC voltage was used on top of a fixed reverse bias, and the current amplitude was measured. Frequencies were from 1 to 20 kHz, well within the range of the amplifiers. Data were only taken at 80 K, where the capacitance is clearly measurable by this method. The current amplitude is shown in FIG. 8A along with the fits to eq 4, derived from a parallel capacitor-resistor model:

$$|i| = \sqrt{(\omega C)^2 + \left(\frac{1}{R}\right)^2} |V| \quad (4)$$

Figure 8B:
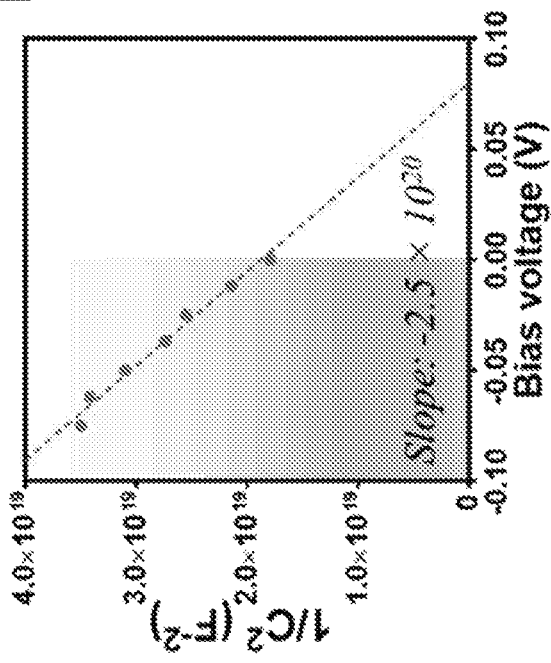
Figure 8C:
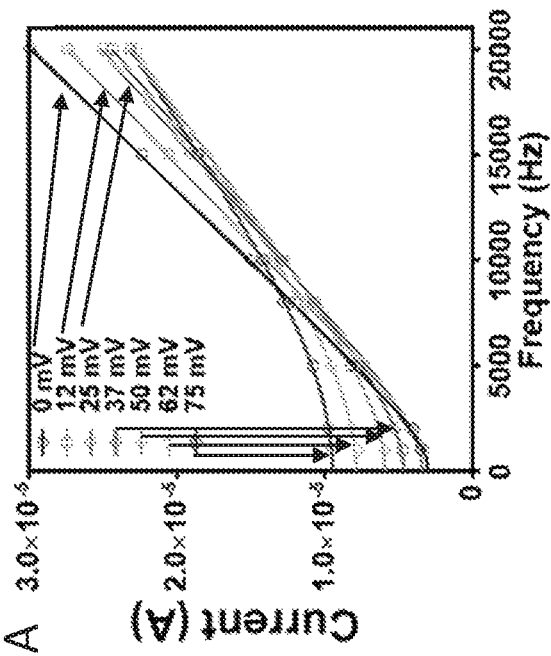
Figure 8D:
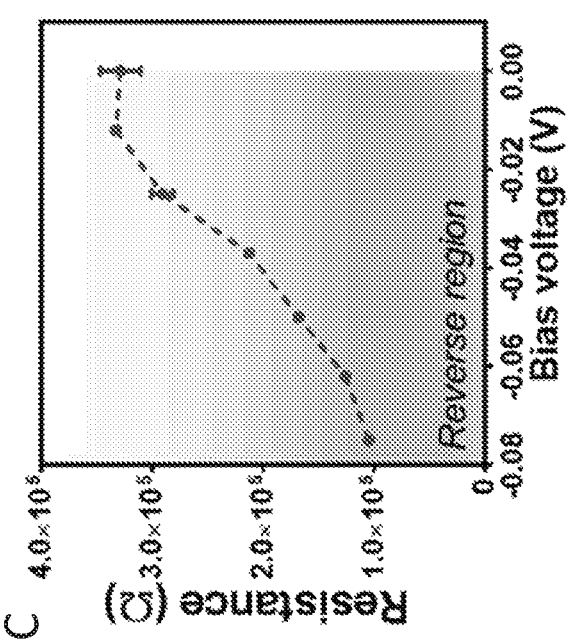

The extracted capacitance C and resistance R are shown in FIGS. 8B and 8C. The zero-bias resistance of 300 kΩ is equivalent to the shunt resistance extracted from J(V) curve fitting.

The capacitance depends on the depletion layer thickness, and it is expected to vary with bias voltage as $$\frac{1}{C^2} = \frac{2}{\varepsilon \varepsilon_0 e N A^2}(V_{BI} - V) \quad (5)$$

where A is the device area, V is the applied DC bias voltage, $V_{BI}$ is the built-in potential, and N is a dopant density. In a p-n junction with well-defined $N_d$ and $N_a$ donor and acceptors, $N = N_a N_d/(N_a + N_d)$. The linear variation of $1/C^2$ with reverse bias is observed in FIG. 8D. Assuming a dielectric constant of 6, based on the optical index of refraction for the HgTe CQD films, and using the measured device area of 0.6 mm$^2$, the majority carrier density was N=2.6±0.1×10$^{15}$ cm$^{-3}$, which corresponds to 0.68±0.22×10$^{-3}$ elementary charge per dot. The doping was not assigned to specific dopants inside the CQDs. Instead, in CQDs, the energy levels are dependent on surface conditions. The low doping level merely confirms that the EdT/HCl treatment for these HgTe CQD films provides near-intrinsic conditions. Assuming that this residual doping is in fact representative of a weakly n-type material, another estimate of the p-doping of the top contact can be provided using the slope of the temperature-dependent $V_{oc}$. This leads to a much stronger p-doping density of ~10$^{19}$ cm$^{-3}$, which may be an upper estimate.

At zero bias, the depletion width is given by d=εεA/C and was ~140 nm for a device area of 0.6 mm$^2$. The HgTe film thickness was 470±20 nm, measured by atomic force microscopy (AFM). The high quantum efficiency at low temperature arises because the depletion width is wide enough, whereas the diffusion length is longer than the device, such that carriers are swept to the electrodes. However, as temperature increases, diffusion length and depletion width both decrease, therefore reducing carrier extraction. For higher temperatures, higher quantum efficiencies should be sought by further optimizing the doping profile.

The internal quantum efficiency (IQE) is determined by dividing the measured EQE by the absorption in the active layer calculated from a 1D dielectric model of the device. Using IR absorption measurements of HgTe films of several thicknesses, it was found that the index of refraction is well described by a real part n=2.3 and an imaginary part k=0.1 above the absorption edge. As shown in FIG. 9A, the calculated MWIR absorption in the ~400 nm HgTe film in the device is ~18%, which is similar to the EQE of ~17%, within the uncertainty of both values. This suggests that high IQE is readily achieved at low temperatures.

To further improve the device EQE at low temperatures, the light collection must therefore be increased. Enhanced absorption can be achieved by better light management. Here, a simple optical interference structure was used on the HgTe CQDs MWIR detector that required only a deposition of an optical spacer and a back reflector.

Figure 9D:
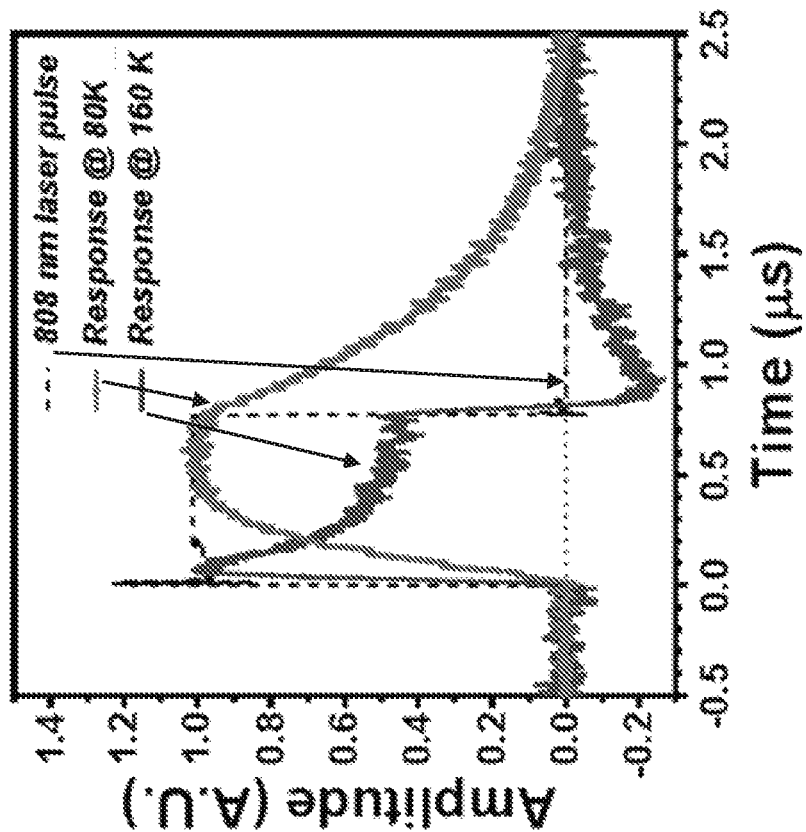
Figure 9C:
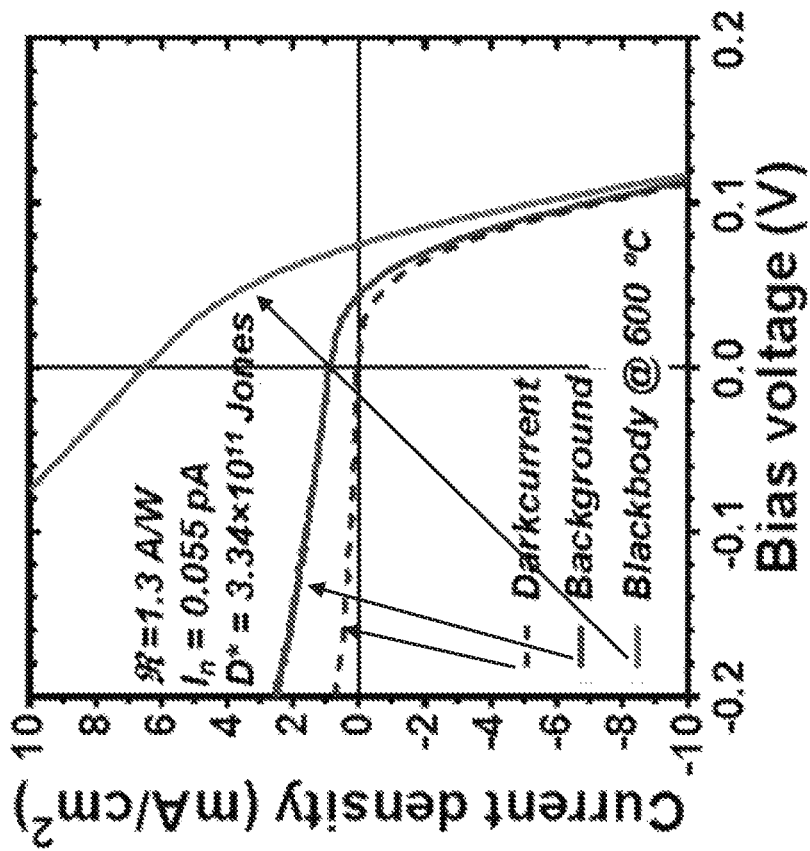

The design of the interference structure is shown in the inset of FIG. 9A. Electron beam evaporation is used to deposit a 5 nm thin Au electrode, 200-500 nm SiO$_2$ spacer, and a 100 nm Au film reflector over the device. FIG. 9A shows simulation results for the optical absorption of the HgTe layer as a function of the thickness of the optical spacer. The simulated peak optical absorption in the MWIR by the HgTe CQDs layer reached 53% with a 0.2 μm thick spacer. The measured spectral photocurrent of HgTe CQDs photodetectors with and without interference structure is shown in FIG. 9B. By changing the thickness of the optical spacer from 0.5 to 0.2 μm, the interference peaks were tuned to match the MWIR (3-5 μm), in agreement with the simulations. As shown in FIG. 9C, the responsivity of the interference-enhanced HgTe CQD photodetector was improved to 1.3 A/W at 85 K, corresponding to an EQE of 32%. Moreover, the fabrication process of the interference structure neither degraded the built-in potential nor increased the noise level. At 85 K, the measured noise spectral density of a 0.02 mm$^2$ device was 0.055 pA Hz$^{-1/2}$ with the cold shield of the cryostat closed, increasing to 0.2 pA Hz$^{-1/2}$ with the cold shield open, indicating BLIP. The detectivity of 3.3×10$^{11}$ Jones was also significantly improved compared to that of the detector without interference structure.

In addition to the sensitivity of a MWIR detector, the response time is an important specification for infrared imaging. Using a pulsed 808 nm laser, the rise time and fall time were 0.3 and 1 s at 85 K, respectively (FIG. 9D). The microsecond response likely resulted from the RC constant of the detector and not from carrier lifetimes. The shunt resistance was 1 MΩ; therefore, the capacitance would have to be 1 pF. This is close to 2 pF estimated for a device of 400 nm thickness, 0.02 mm$^2$ area, and a dielectric constant of 6, calculated as a parallel plate capacitance. At higher temperatures, the response time decreases to less than 50 ns but at the cost of increased noise levels and reduced sensitivity.

As a visual demonstration of the HgTe CQDs MWIR detector, a single pixel, interference-enhanced HgTe CQD detector of 0.02 mm$^2$ area was set up for scan imaging. Such scan imaging is possible because of the high stability and low 1/f noise of the device. A ZnSe lens with a 30 mm focal length was scanned to project images of objects placed 40 cm away. The number of sampled data points in the horizontal and vertical directions were 500 and 75, respectively. The horizontal lines were scanned in 0.5 s, giving 1 ms illumination per data point and a total collection time of 1 min. The fast response is apparent in the well-resolved horizontal contrast. The noise-equivalent temperature difference (NETD) of the image was ~56 mK. As an anecdotal indication of the stability of the devices to thermal cycling and water contamination, the images were taken over a period of 2 weeks with a device cooled about 50 times from room temperature to 90 K under moderate vacuum of ~50 mTorr.

Example 3: Single-Band Extended Shortwave Infrared Photodiode

This example illustrates the fabrication and operation of single-band extended shortwave infrared (eSWIR) photodiodes based on HgTe CQDs.

Methods

HgTe Synthesis. HgTe CQDs were synthesized according to previously reported procedures. (S. Keuleyan, et al., J. Am. Chem. Soc. 133, 16422 (2011).) A stock solution of 1 M tellurium precursor was prepared by dissolving tellurium shot in trioctylphosphine at 100° C. overnight in a nitrogen filled glovebox. HgCl$_2$ (0.1 mmol) was dissolved in oleylamine (5 mL) at 100° C. in a nitrogen filled glovebox for 1 hour. The reaction temperature was reduced to 85° C. TOPTe (0.1 mL) was diluted in oleylamine (5 mL), and the mixture was rapidly injected into the HgCl$_2$—OAm solution. The reaction proceeded for 1 to 5 minutes. For example, a 4-minute reaction produced HgTe CQDs with a cutoff at about 2.35 µm. Shorter reaction times yield smaller quantum dots with higher energy absorption cutoff. The reaction solution was cooled to room temperature and diluted with tetrachloroethylene (5 mL), 1-dodecanethiol (1 mL), and trioctylphosphine (1 mL). The solution was precipitated once with ethanol and then dissolved in chlorobenzene (4 mL). Occasionally, a white gel was observed and difficult to remove while cleaning. To prevent the white gel formation, additional trioctylphosphine was added to the turbid solution following the addition of ethanol but before centrifuging the solution.

The HgTe CQD photodiodes were fabricated on an infrared-transparent sapphire substrate. A solution of HgTe CQDs was drop-casted onto a transparent conducting electrode at 40° C. layer-by-layer to build up thin films of 300 to 400 nm. Here, a HgCl$_2$ treatment was introduced to each layer of HgTe CQDs. Each layer of HgTe CQDs was exposed to a 10 mM HgCl$_2$-methanol solution and followed by crosslinking with a 1:1:20 by volume solution of EdT, hydrochloric acid (HCl), and IPA. Hereafter, photodiodes prepared with HgCl$_2$ in this fashion are referred to as "HgCl$_2$-treated." For comparison, "EdT/HCl-only" photodiodes were prepared by the same procedure but the HgCl$_2$ step was omitted. After complete deposition of the HgTe CQD film, a junction was formed by spin-coating a thin film of Ag$_2$Te nanoparticles and exposing it to a HgCl$_2$ solution, as detailed in Examples 1 and 2. A 50 nm gold electrode was then evaporated to pattern an area of ~1 mm$^2$ as defined by the overlap with the bottom transparent conducting electrode. The effects of the HgCl$_2$ treatment on the HgTe CQD films were investigated by measuring optical and electrical behavior of the photodiodes as a function of temperature.

Photodiode Characterization. HgTe CQD photodiodes were placed in a closed-cycle helium-pump cryostat for measurements at temperatures between 80 K and 300 K. A 600° C. calibrated blackbody source was used to illuminate the sample through the sapphire/ITO substrate. The light from the blackbody was chopped at 200 Hz, and the signal was measured using a Femto DLPCA-200 low-noise transimpedance amplifier, a Stanford Research Instruments Low-Noise Preamplifier, and oscilloscope. The noise spectral density of the photodiode was measured using a Stanford Research Instruments FFT Noise Spectrum Analyzer. Current-voltage measurements were performed using an Agilent Function Generator to apply a bias, and the current was measured using a National Instruments data acquisition system. The spectral response was measured using the external detector port of a Nicolet Magna IR 550 FTIR and normalized to the internal DTGS thermal detector. The response time was measured using a Stanford Research Systems Model SR445 preamplifier, Picoscope 3206D oscilloscope, and a 1350 nm laser diode. The area of the HgTe CQD photodiode was measured using an optical microscope, and the thickness was measured using a Bruker Dektak XT-S profilometer.

In the extreme case, exposure of HgTe CQDs to HgCl$_2$ leads to significant etching and complete dissolution. However, at the concentration used here, the HgCl$_2$ treatment had a negligible effect on the spectral response of the photodiode, as shown in FIG. 10A. The difference of ~70 cm$^{-1}$ in the photodiode cutoff wavelengths, defined as 50% of peak response, is due to batch-to-batch variations in the synthesis and is not attributed to etching of the dots.

Figure 10B:
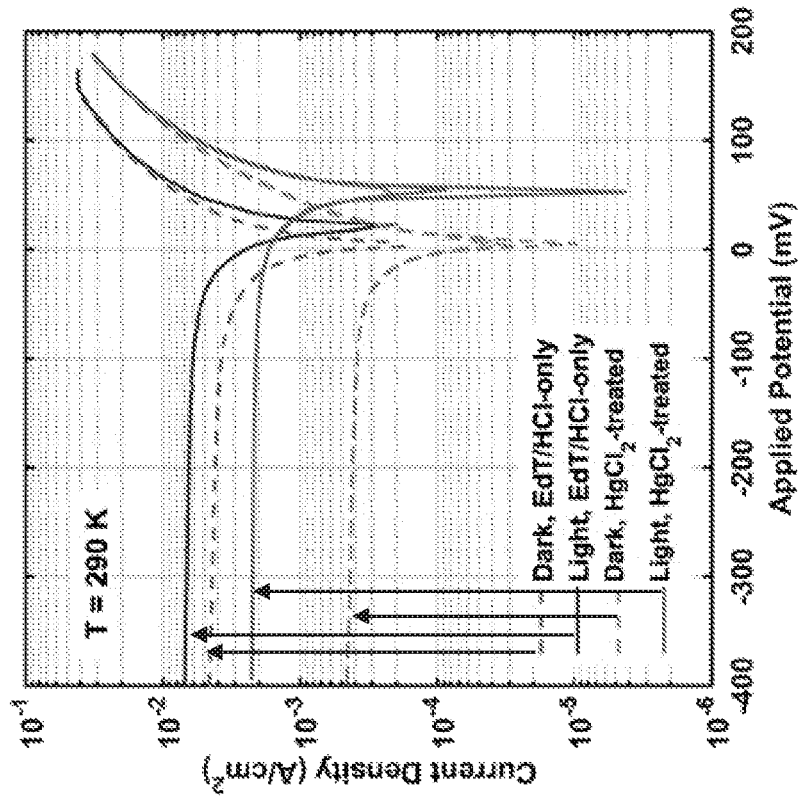
FIGS. 10A-10C depict HgTe CQD photodiodes at 2.5 μm.
Figure 10A:
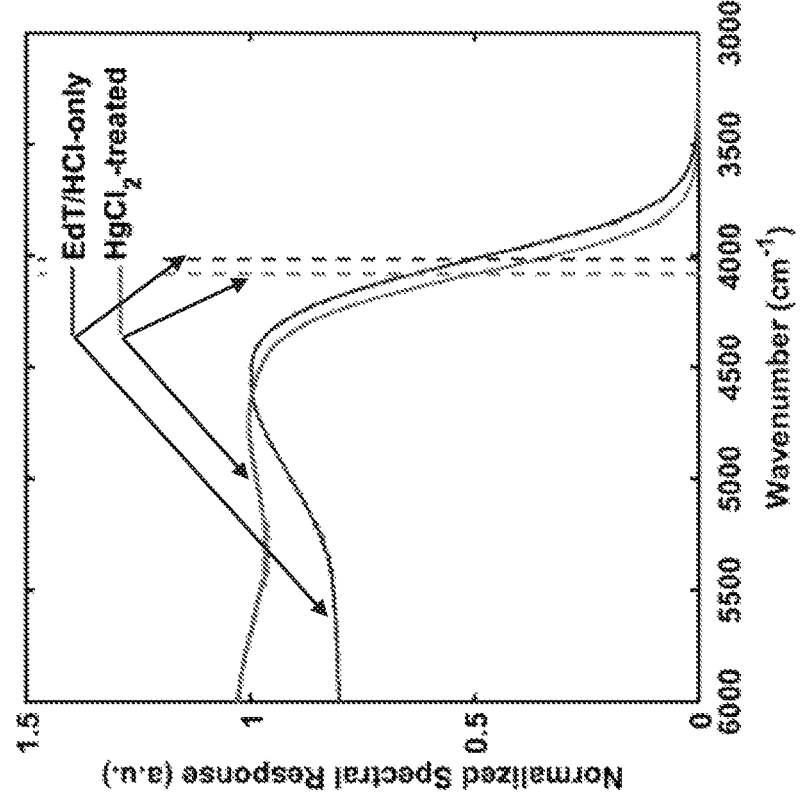

The main benefit of the HgCl$_2$ treatment is evidenced in FIG. 10B, which shows the current density-voltage (JV) behavior of photodiodes with a 2.5 µm cutoff at 290 K. Indeed, while the photocurrent density at zero bias is mostly unaffected by the HgCl$_2$ exposure, the shunt resistance-area product ($R_0A$) of the photodiode increases up to 10-fold from ~10 Ωcm$^2$ to 100 Ωcm$^2$. The increase in $R_0A$ suggests the HgCl$_2$ treatment may increase the minority carrier lifetime, which is consistent with the discussion of the photoluminescence to follow.

From FIG. 10B, $J_0$ decreased 10-fold from about 4×10$^{-3}$ A/cm$^2$ to 4×10$^{-4}$ A/cm$^2$ when treated with HgCl$_2$ solution. This means that the solution-processed HgCl$_2$-treated photodiodes at 2.5 µm described here have room temperature dark current densities that already approach those of epitaxial InGaAs photodetectors. For example, an InGaAs photodiode from Hamamatsu model G12183-030K with a 2.55 µm cutoff at 295 K has a dark current density of 3×10$^{-4}$ at 500 mV reverse bias.

Figure 10C:
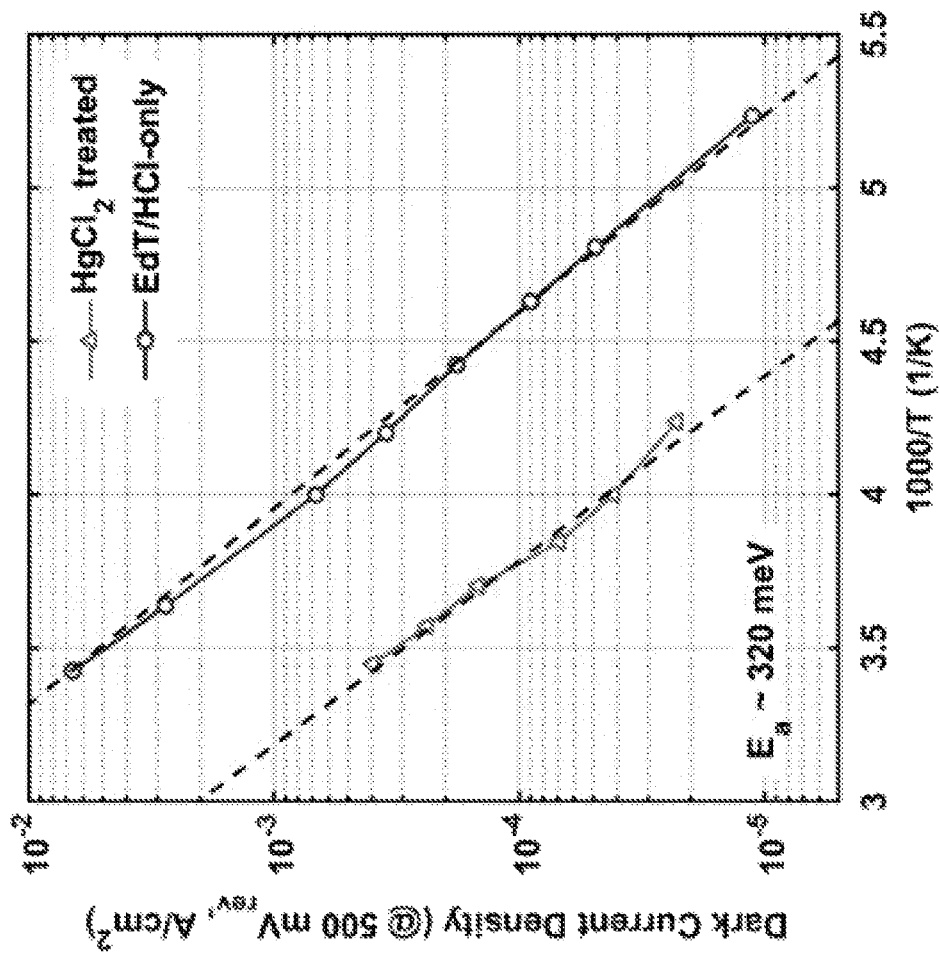

FIG. 10C shows that the dark current density for each photodiode, measured at a fixed reverse bias of 500 mV from 200-300 K, follows an Arrhenius behavior. The activation energy of the dark current density is 320 meV for both EdT/HCl-only and HgCl$_2$-treated photodiodes. The similar activation energy for both diodes suggests that the dominant mechanism for dark current generation is the same. Given the cutoff wavelength of 2.5 µm, the activation energy is slightly larger than half the band gap energy, indicating that the dark current density is dominated by space-charge limited generation-recombination.

Figure 11B:
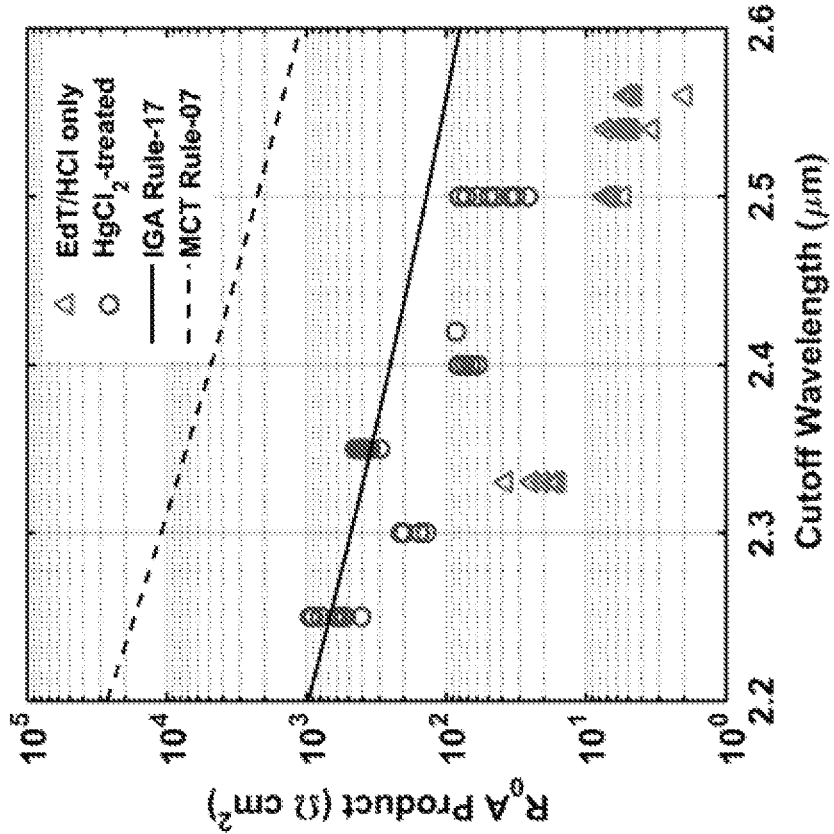
FIGS. 11A-11C depict HgTe short-wave photodiodes at 300 K and zero bias.
Figure 11A:
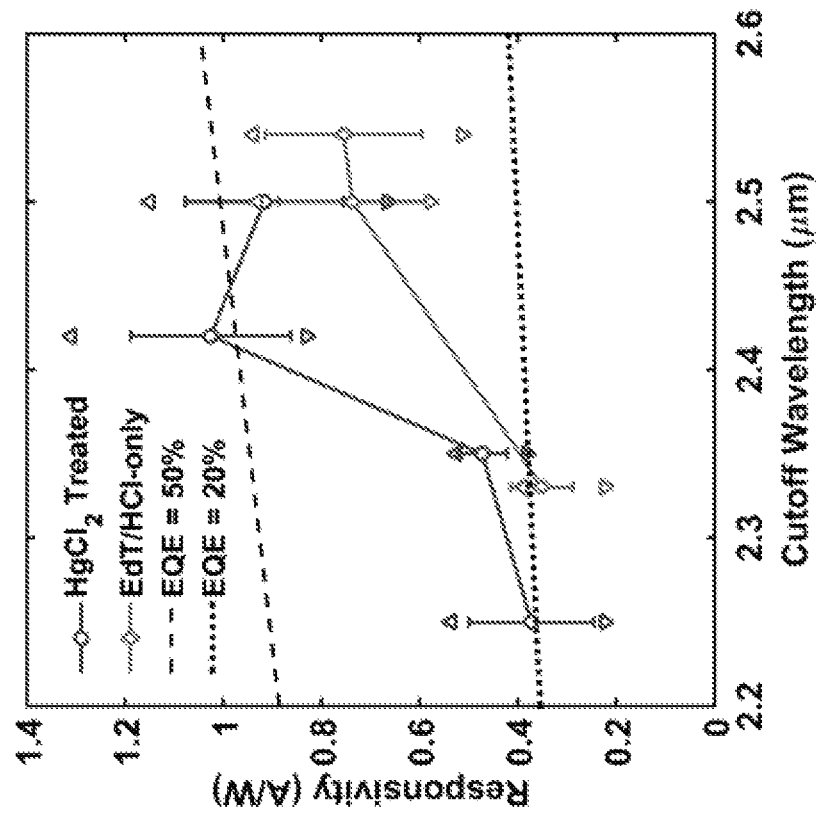
Figure 11C:
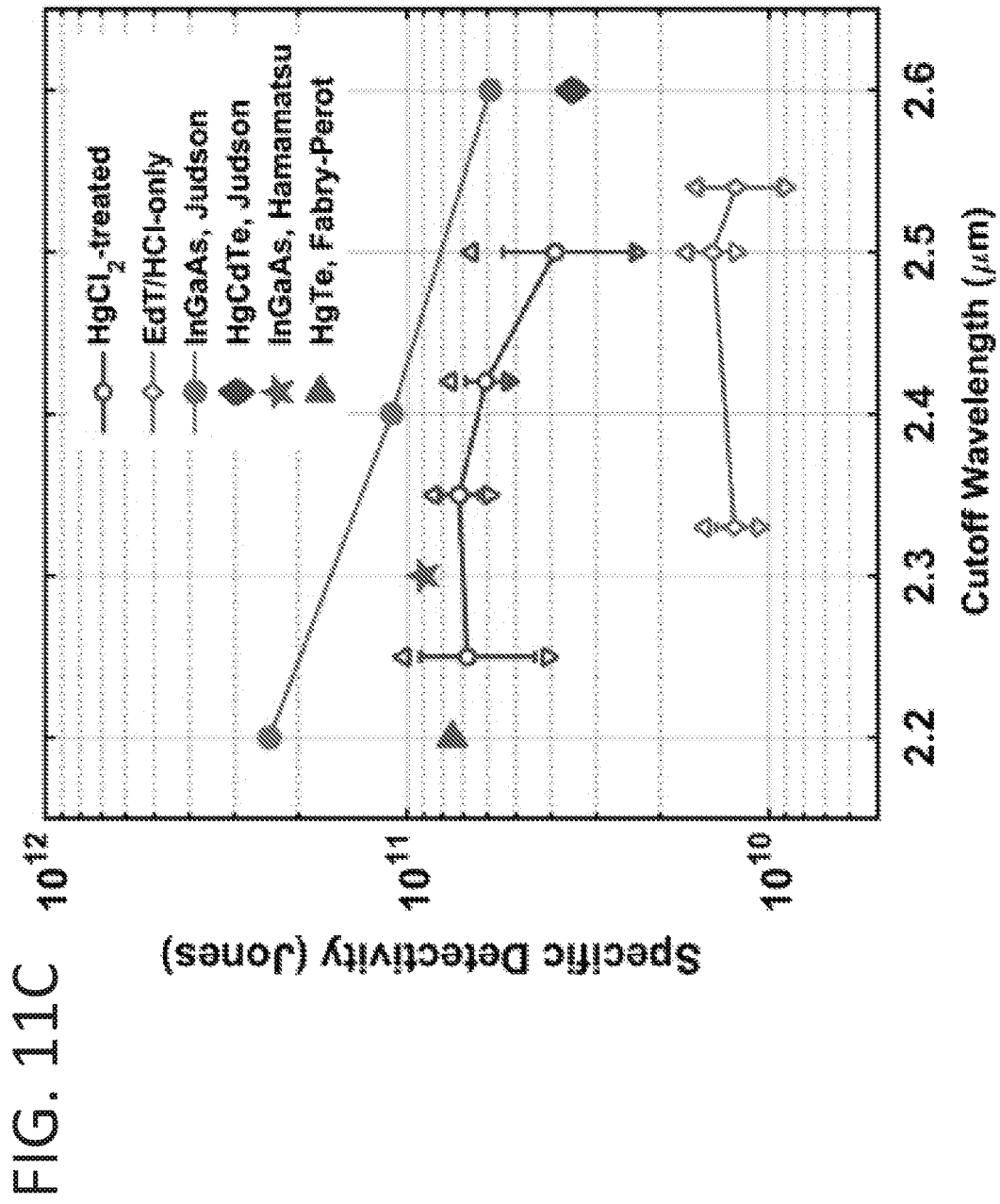

FIGS. 11A-11C show a compilation of data from individual HgCl$_2$-treated and EdT/HCl-only photodiodes with cutoff wavelengths from 2.2 to 2.5 µm operating at 300 K with zero bias. The average values and extreme values are shown for the responsivity, $\mathcal{R}$, zero-bias resistance-area product, R$_0$A, and specific detectivity, D*. FIG. 11A shows that the unbiased HgCl$_2$-treated photodiode can exceed an EQE of 50% for a cutoff between 2.4 and 2.5 µm. FIG. 11A also shows that the EQE decreases by a factor of 2 at cutoff wavelengths below 2.4 µm. As the cutoff wavelength decreased, a kink in the JV characteristic under small applied bias was observed. The kink is explained by a potential barrier that arises as the carriers accumulate at the cathode, leading to an increased recombination rate and decreased photocurrent density. Such an effect could occur as the HgTe CQD Fermi level decreases with respect to the work function of the ITO. Therefore, it is expected that an electrode better matched to the conduction band edge and Fermi level energy of wider gap HgTe CQDs will improve the $\mathcal{R}$ as much as 2-fold, consistent with the 50% EQE observed for photodiodes at longer wavelengths. With optimized charge collection layers, the detectivity at shorter wavelengths, being limited by the $\mathcal{R}$ is expected to improve by as much as a factor of 2.

FIG. 11B shows the R$_0$A product at room temperature of HgTe CQD photodiodes compared to eSWIR InGaAs (IGA Rule-17, solid black line) and HgCdTe (MCT Rule-07, dashed black line). (Zhang, 2018 and Tennant, 2010.) R$_0$A was calculated from the measured noise, assuming a Johnson noise limit, and slope at zero bias of the JV curves. HgCl$_2$-treated photodiodes match closely to the InGaAs R$_0$A while the best HgCdTe photodetectors have 10-fold higher R$_0$A. FIG. 11C shows the specific detectivity, D*. For all the devices, the noise was measured using an FFT noise spectrum analyzer and found to be frequency-independent. Therefore, D* was calculated according to $$D^* = \frac{\mathcal{R}\sqrt{A\Delta f}}{i_n} \quad (6)$$

where D* is in cmHz$^{1/2}$W$^{-1}$ or Jones, A is the photodiode optical area in cm$^2$, $\Delta f$ is the noise-equivalent electrical bandwidth and here equal to 1 Hz, and i$_n$ is noise current in amps. The D* of reported and commercial detectors of 1 mm$^2$ area operated at room temperature are also provided. HgCl$_2$-treated photodiodes are approaching the performance of InGaAs (Hamamatsu, G12183-010K, Teledyne-Judson, J23-18I-R01M) and HgCdTe (Teledyne-Judson, J19:2.8-18C-R01M) photodiodes in the eSWIR with only a factor of 3 difference in D*. Prior work on EdT/HCl-only HgTe CQD photodiodes reported a D* of 3×10$^{10}$ Jones at room temperature. (Tang, 2019.) From FIG. 11C, the HgCl$_2$ treatment allows a maximum measured specific detectivity of 1.2×10$^{11}$ Jones, which is 4-fold larger than for previously reported HgTe CQD photodiodes. Furthermore, at least an additional 2-fold increase will be possible by using a resonant cavity.

In addition to the sensitivity of the detector, the response time is critical to imaging applications that depend on fast response speeds. For the HgCl$_2$-treated photodiodes, rise and fall response times of 450 ns and 1.4 µs, respectively, were measured. The fall time was limited by a circuit response time of 1.3 µs, calculated from the measured capacitance of 1.9 nF and load resistance of ~700Ω.

The origins of the performance improvements using the HgCl$_2$ treatment are partially assigned to improvement of the carrier lifetime consistent with the change in photoluminescence. As shown in FIG. 12A, the photoluminescence (PL) of eSWIR HgTe CQD films before and after solid state ligand exchange with EdT/HCl exhibits a significant drop of at least 10-fold. In contrast, the PL decreased no more than 2-fold when treated with HgCl$_2$. Since the maximum possible R$_0$A is proportional to the PL quantum efficiency, this could explain some of the improvement. The HgCl$_2$ may improve the PL due to passivation of the surface by halides.

The microscopic details of the device are also affected by the treatment. As shown in FIG. 12B, electrochemical energetic studies show that the HgCl$_2$ treatment tends to make the HgTe films less p-type compared to the EdT/HCl treatment as indicated by the relative position of the Fermi level (FIG. 12B, dashed lines) with respect to the band edges. The decreased doping level may contribute to the formation of a more ideal diode. As shown in FIG. 12C, despite the 2-fold decrease in mobility with the HgCl$_2$ treatment, the improved carrier lifetime, which is consistent with the increase in PL, more than compensates for the lower mobility.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of doping a film of colloidal semiconductor quantum dots, the method comprising:
   forming a film of colloidal quantum dots, the colloidal quantum dots comprising a quantum dot cation and a quantum dot anion;
   depositing semiconductor nanoparticles on the film of colloidal quantum dots, the semiconductor nanoparticles comprising a nanoparticle cation and a nanoparticle anion, wherein the nanoparticle anion is the same anion as the quantum dot anion; and
   contacting the deposited semiconductor nanoparticles with a solution comprising quantum dot precursors in a solvent, the quantum dot precursors comprising a precursor cation and a precursor anion, wherein the quantum dot precursors undergo cation exchange with the semiconductor nanoparticles and the film of colloidal quantum dots becomes doped with nanoparticle cations that are released from the semiconductor nanoparticles during the cation exchange.

2. The method of claim 1, wherein the colloidal quantum dots are colloidal mercury chalcogenide quantum dots.

3. The method of claim 2, wherein the mercury chalcogenide quantum dots are HgTe quantum dots.

4. The method of claim 3, wherein the nanoparticle cations are silver ions.

5. The method of claim 4, wherein the semiconductor nanoparticles are $Ag_2Te$ nanoparticles and the quantum dot precursors are $HgCl_2$.

6. The method of claim 1, wherein the colloidal quantum dots are colloidal lead chalcogenide quantum dots or colloidal cadmium chalcogenide quantum dots and the nanoparticle cations are nickel cations, antimony cations, or tin cations.

7. A multi-band photodetector comprising:
a first photodiode comprising a first layer of colloidal quantum dots;
a second photodiode arranged in a stacked, back-to-back configuration with the first photodiode, the second photodiode comprising a second layer of colloidal quantum dots;
a p-doped region doped with silver ions and formed within the first layer of colloidal quantum dots at an interface between the first and second photodiodes;
a p-doped region doped with silver ions and formed within the second layer of colloidal quantum dots at the interface between the first and second photodiode;
a first electrode in electrical communication with the first photodiode;
a second electrode in electrical communication with the second photodiode, wherein at least one of the first and second electrodes is transparent across at least a portion of the electromagnetic spectrum; and
a voltage source configured to apply and adjust a bias voltage across the first and second electrodes, whereby the first photodiode exhibits a photoresponse over a first wavelength range when biased within a first range of bias voltages and the second photodiode exhibits a photoresponse over a second wavelength range when biased within a second range of bias voltages.

8. The photodetector of claim 7, wherein the first photodiode comprises a first n-type layer between the first layer of colloidal quantum dots and the first electrode, wherein the first n-type layer and the first p-doped region form a first rectifying junction, and further wherein the second photodiode comprises a second n-type layer between the second layer of colloidal quantum dots and the second electrode, wherein the second n-type layer and the second p-doped region form a second rectifying junction.

9. The photodetector of claim 8, wherein at least one of the first n-type layer and the second n-type layer comprises bismuth chalcogenide nanoparticles.

10. The photodetector of claim 9, wherein the bismuth chalcogenide nanoparticles comprise $Bi_2Se_3$ nanoparticles.

11. The photodetector of claim 7, wherein the first photodiode comprises a first n-doped region in the first layer of colloidal quantum dots, wherein the first n-doped region and the first p-doped region form a first rectifying junction, and further wherein the second photodiode comprises a second n-doped region in the second layer of colloidal quantum dots, wherein the second n-doped region and the second p-doped region form a second rectifying junction.

12. The photodetector of claim 7, wherein the first photodiode exhibits a photoresponse in the 0.9 μm to 2.5 μm region of the electromagnetic spectrum, and the second photodiode exhibits a photoresponse in the 3 μm to 5 μm region of the electromagnetic spectrum.

13. The photodetector of claim 7, wherein the first layer of colloidal quantum dots comprises colloidal quantum dots of a first size, and the second layer of colloidal quantum dots comprises colloidal quantum dots of a second size.

14. The photodetector of claim 7, wherein the first and second layers of colloidal quantum dots comprise colloidal mercury chalcogenide quantum dots.

15. The photodetector of claim 14, wherein the mercury chalcogenide quantum dots are HgTe quantum dots.

16. The photodetector of claim 7, wherein the colloidal quantum dots are colloidal lead chalcogenide quantum dots or cadmium chalcogenide quantum dots.

17. The multi-band photodetector of claim 7, wherein the p-doped region formed within the first layer of colloidal quantum dots extends to a depth within said first layer of colloidal quantum dots of no more than 50% of the thickness of said first layer of colloidal quantum dots and the p-doped region formed within the second layer of colloidal quantum dots extends to a depth within said second layer of colloidal quantum dots of no more than 50% of the thickness of said second layer of colloidal quantum dots.

18. A bias-switchable multi-band photodetector comprising:
a first electrode;
a second electrode, wherein at least one of the first and second electrodes is transparent across at least a portion of the electromagnetic spectrum;
a first layer of colloidal quantum dots comprising HgTe quantum dots of a first size and exhibiting a photoresponse over a first wavelength range;
a second layer of colloidal quantum dots comprising HgTe quantum dots of a second size and exhibiting a photoresponse over a second wavelength range;
a charge carrier tunneling layer formed from neighboring p-doped regions that are doped with silver and formed within in the first and second layers of colloidal quantum dots;
n-type $Bi_2Se_3$ semiconductor nanoparticles between the first electrode and the first layer of colloidal quantum dots and between the second electrode and the second layer of colloidal quantum dots; and
a voltage source configured to apply and adjust a bias voltage across the first and second electrodes.

19. The bias-switchable multi-band photodetector of claim 18, wherein the neighboring p-doped regions that are formed within the first and second layers of colloidal quantum dots extend to a depth within said first or second layer of colloidal quantum dots of no more than 50% of the thickness of said first or second layer of colloidal quantum dots.

20. A photodetector comprising:
a rectifying photodiode comprising a layer of colloidal quantum dots comprising HgTe quantum dots, wherein the photodiode exhibits a photoresponse over a wavelength range when biased within a range of bias voltages;
a first electrode in electrical communication with the rectifying photodiode;
a second electrode in electrical communication with the rectifying photodiode, wherein at least one of the first and second electrodes is transparent across at least a portion of the electromagnetic spectrum;
a p-doped region doped with silver ions and formed within the layer of colloidal quantum dots at the first electrode side of the layer of colloidal quantum dots;
an n-type layer comprising Bi2Se3 nanoparticles between the second electrode and the rectifying photodiode; and a voltage source configured to apply and adjust a bias voltage across the rectifying photodiode.

21. The photodetector of claim 20, wherein the p-doped region formed within the layer of colloidal quantum dots extends to a depth within said layer of colloidal quantum dots of no more than 50% of the thickness of said layer of colloidal quantum dots.

22. A photodetector array comprising a plurality of multi-band photodetectors, the multi-band photodetectors comprising:
   a first photodiode comprising a first layer of colloidal quantum dots;
   a second photodiode arranged in a stacked, back-to-back configuration with the first photodiode, the second photodiode comprising a second layer of colloidal quantum dots;
   a p-doped region doped with silver ions and formed within the first layer of colloidal quantum dots at an interface between the first and second photodiodes;
   a p-doped region doped with silver ions and formed within the second layer of colloidal quantum dots at the interface between the first and second photodiodes;
   a first electrode in electrical communication with the first photodiode;
   a second electrode in electrical communication with the second photodiode, wherein at least one of the first and second electrodes is transparent across at least a portion of the electromagnetic spectrum; and
   a voltage source configured to apply and adjust a bias voltage across the first and second electrodes, whereby the first photodiode exhibits a photoresponse over a first wavelength range when biased within a first range of bias voltages and the second photodiode exhibits a photoresponse over a second wavelength range when biased within a second range of bias voltages.

23. A photodetector array comprising a plurality of photodetectors, the photodetectors comprising:
   a rectifying photodiode comprising a layer of colloidal quantum dots comprising HgTe quantum dots, wherein the photodiode exhibits a photoresponse over a wavelength range when biased within a range of bias voltages;
   a first electrode in electrical communication with the rectifying photodiode;
   a second electrode in electrical communication with the rectifying photodiode, wherein at least one of the first and second electrodes is transparent across at least a portion of the electromagnetic spectrum;
   a p-doped region doped with silver ions and formed within the layer of colloidal quantum dots at the first electrode side of the layer of colloidal quantum dots;
   an n-type layer comprising $Bi_2Se_3$ nanoparticles between the second electrode and the rectifying photodiode; and
   a voltage source configured to apply and adjust a bias voltage across the rectifying photodiode.

24. A dual band photodetection method using a photodetector comprising:
   a first photodiode comprising a first layer of colloidal quantum dots;
   a second photodiode arranged in a stacked, back-to-back configuration with the first photodiode, the second photodiode comprising a second layer of colloidal quantum dots;
   a p-doped region doped with silver ions and formed within the first layer of colloidal quantum dots at an interface between the first and second photodiodes;
   a p-doped region doped with silver ions and formed within the second layer of colloidal quantum dots at the interface between the first and second photodiodes;
   a first electrode in electrical communication with the first photodiode;
   a second electrode in electrical communication with the second photodiode, wherein at least one of the first and second electrodes is transparent across at least a portion of the electromagnetic spectrum; and
   a voltage source configured to apply and adjust a bias voltage across the first and second electrodes, whereby the first photodiode exhibits a photoresponse over a first wavelength range when biased within a first range of bias voltages and the second photodiode exhibits a photoresponse over a second wavelength range when biased within a second range of bias voltages, the method comprising alternately applying across the first and second electrodes, a first voltage bias in the first range of bias voltages and a second voltage bias in the second range of bias voltages.

* * * * *